(12) United States Patent
Popp et al.

(10) Patent No.: US 9,721,993 B2
(45) Date of Patent: Aug. 1, 2017

(54) METHOD FOR OPERATING AN ORGANIC OPTOELECTRONIC COMPONENT

(71) Applicant: OSRAM OLED GmbH, Regensburg (DE)

(72) Inventors: Michael Popp, Freising (DE); Marc Philippens, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/184,633

(22) Filed: Jun. 16, 2016

(65) Prior Publication Data

US 2016/0300887 A1 Oct. 13, 2016

Related U.S. Application Data

(63) Continuation of application No. 14/762,751, filed as application No. PCT/EP2014/051329 on Jan. 23, 2014, now Pat. No. 9,401,387.

(30) Foreign Application Priority Data

Jan. 25, 2013 (DE) ........................ 10 2013 201 212

(51) Int. Cl.
*H05B 37/02* (2006.01)
*H01L 27/28* (2006.01)
(Continued)

(52) U.S. Cl.
CPC ........ *H01L 27/288* (2013.01); *H01L 51/5281* (2013.01); *H05B 33/0896* (2013.01); *H05B 37/0218* (2013.01); *H03K 2017/9634* (2013.01)

(58) Field of Classification Search
CPC .............. H01L 27/3225; H01L 27/288; H05B 33/0896; H05B 37/0218
(Continued)

(56) References Cited

U.S. PATENT DOCUMENTS 7,515,125 B2  4/2009  Yamazaki et al.
8,729,502 B1 *  5/2014  Klotzkin ............ G01N 21/6428
                                                    250/458.1

(Continued)

FOREIGN PATENT DOCUMENTS

CN    1835056 A      9/2006
DE    10244452 A1 *  4/2004  ......... H03K 17/9631
(Continued)

OTHER PUBLICATIONS

Machine translation of DE 10244452 A1, Apr. 2004.*
(Continued)

*Primary Examiner* — Douglas W Owens
*Assistant Examiner* — Syed M Kaiser
(74) *Attorney, Agent, or Firm* — Slater Matsil, LLP

(57) ABSTRACT

A method is specified for operating an organic optoelectronic component, which has at least one organic light-emitting element having an organic functional layer stack with at least one organic light-emitting layer between two electrodes and at least one organic light-emitting element having an organic light-detecting layer. These elements are arranged on a common substrate in laterally adjacent area regions. The at least one organic light-detecting element detects ambient light, which is incident onto the organic optoelectronic component. The intensity of the light emitted by the at least one organic light-emitting element is regulated depending on a signal of the at least one organic light-detecting element with a characteristic signal form.

16 Claims, 13 Drawing Sheets

(51) Int. Cl.
*H05B 33/08* (2006.01)
*H01L 51/52* (2006.01)
*H03K 17/96* (2006.01)

(58) Field of Classification Search
USPC ....... 315/151, 152, 360, 307, 296, 297, 315, 315/318
See application file for complete search history.

(56) References Cited

U.S. PATENT DOCUMENTS

| | | | |
|---|---|---|---|
| 2003/0047736 A1 | 3/2003 | Hayashi et al. | |
| 2004/0031965 A1 | 2/2004 | Forrest et al. | |
| 2004/0200953 A1* | 10/2004 | Cok | H01L 27/3269 250/214 R |
| 2006/0044800 A1 | 3/2006 | Reime | |
| 2009/0046362 A1* | 2/2009 | Guo | B82Y 40/00 359/485.05 |
| 2011/0141381 A1* | 6/2011 | Minikey, Jr. | B60R 1/088 349/11 |
| 2011/0171789 A1* | 7/2011 | Korgel | H01L 29/42332 438/151 |
| 2011/0234558 A1* | 9/2011 | Ludwig | H04N 9/045 345/207 |
| 2011/0273377 A1* | 11/2011 | Merz | G09G 3/20 345/173 |
| 2012/0006978 A1* | 1/2012 | Ludwig | G06F 3/0412 250/214.1 |
| 2012/0091923 A1 | 4/2012 | Kastner-Jung et al. | |
| 2012/0206050 A1* | 8/2012 | Spero | B60Q 1/04 315/152 |
| 2012/0274596 A1 | 11/2012 | Ludwig | |
| 2013/0061930 A1* | 3/2013 | Atienzar | H01L 51/0086 136/263 |
| 2013/0106294 A1* | 5/2013 | Rakuff | F21S 9/024 315/154 |
| 2013/0155723 A1 | 6/2013 | Coleman | |
| 2014/0339987 A1* | 11/2014 | Burrows | H05B 33/0896 315/153 |
| 2015/0061504 A1* | 3/2015 | Krall | H05B 33/0872 315/151 |

FOREIGN PATENT DOCUMENTS

| | | |
|---|---|---|
| DE | 102009030317 A1 | 1/2011 |
| EP | 1467408 A2 | 10/2004 |
| WO | 2004017413 A1 | 2/2004 |
| WO | 2010066245 A1 | 6/2010 |

OTHER PUBLICATIONS

Bürgi, L., et al., "Integrated optical proximity sensor based on organic photodiodes and organic LEDs," Proceedings of SPIE, vol. 5961, pp. 596104-1-596104-3.

Fraunhofer IPMS, "Feel the Light: OLED With Touch Function," Science Daily, Oct. 19, 2008, 1 page.

* cited by examiner

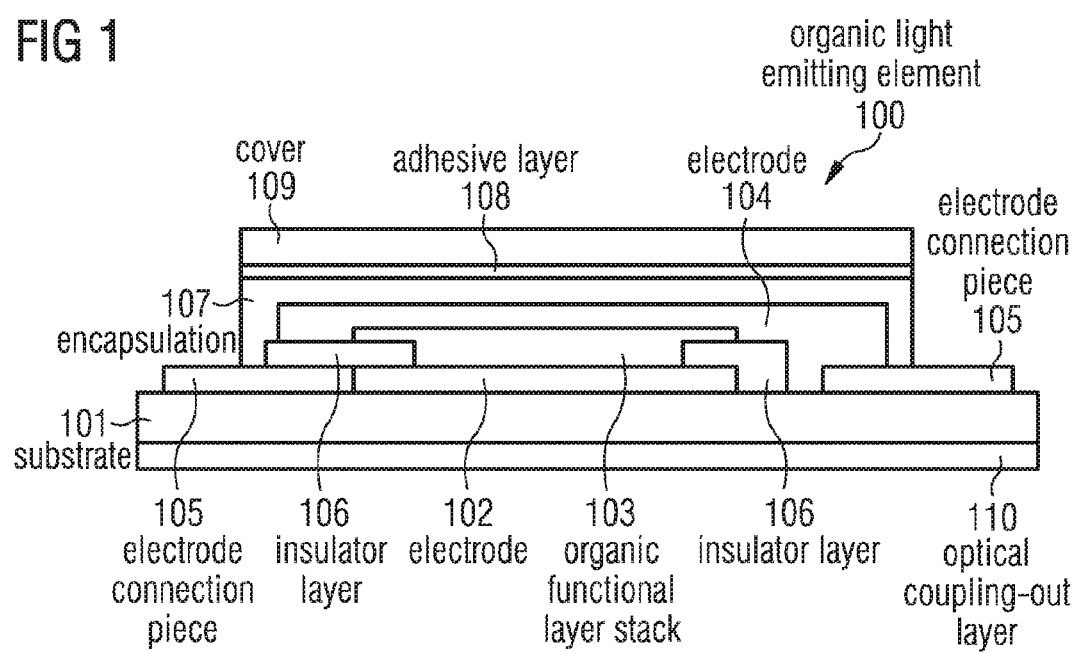

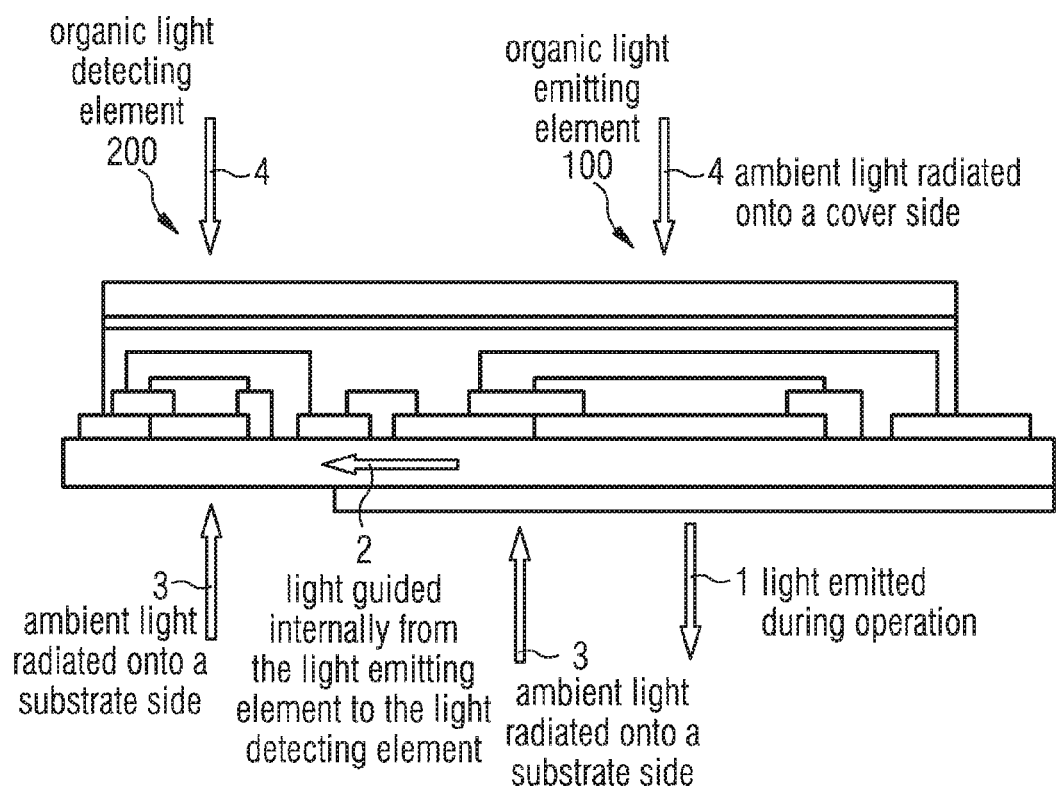
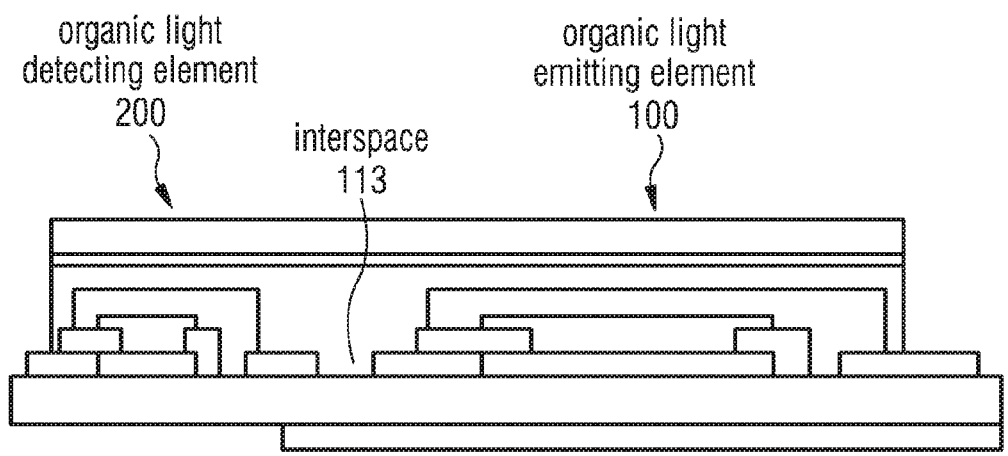

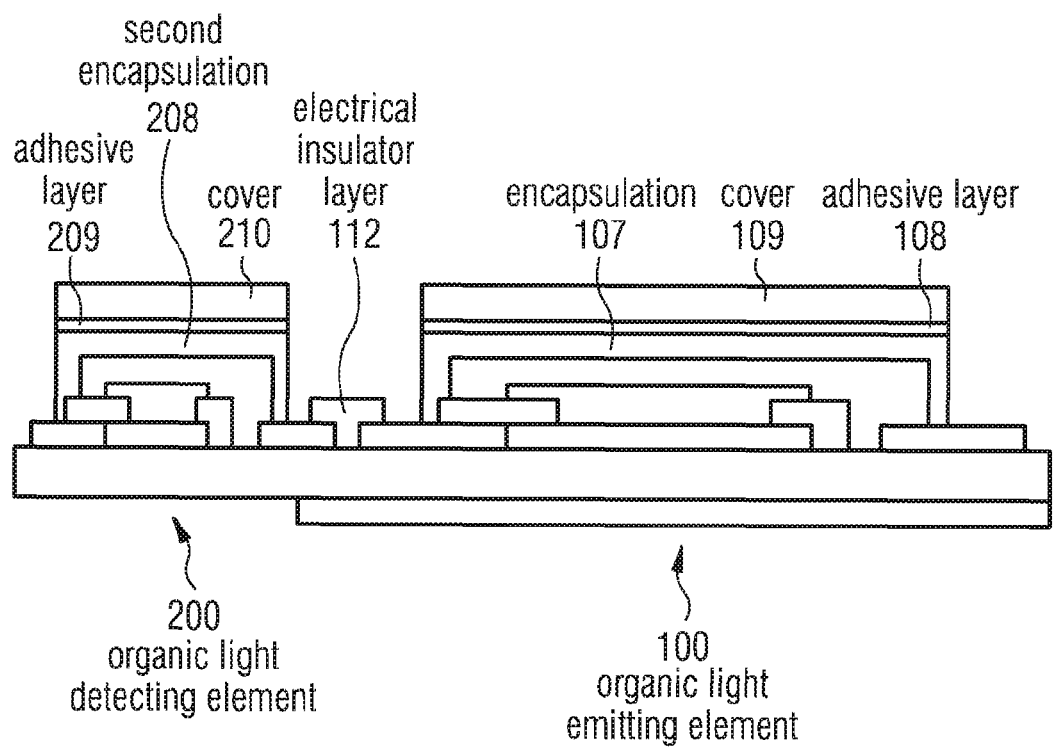
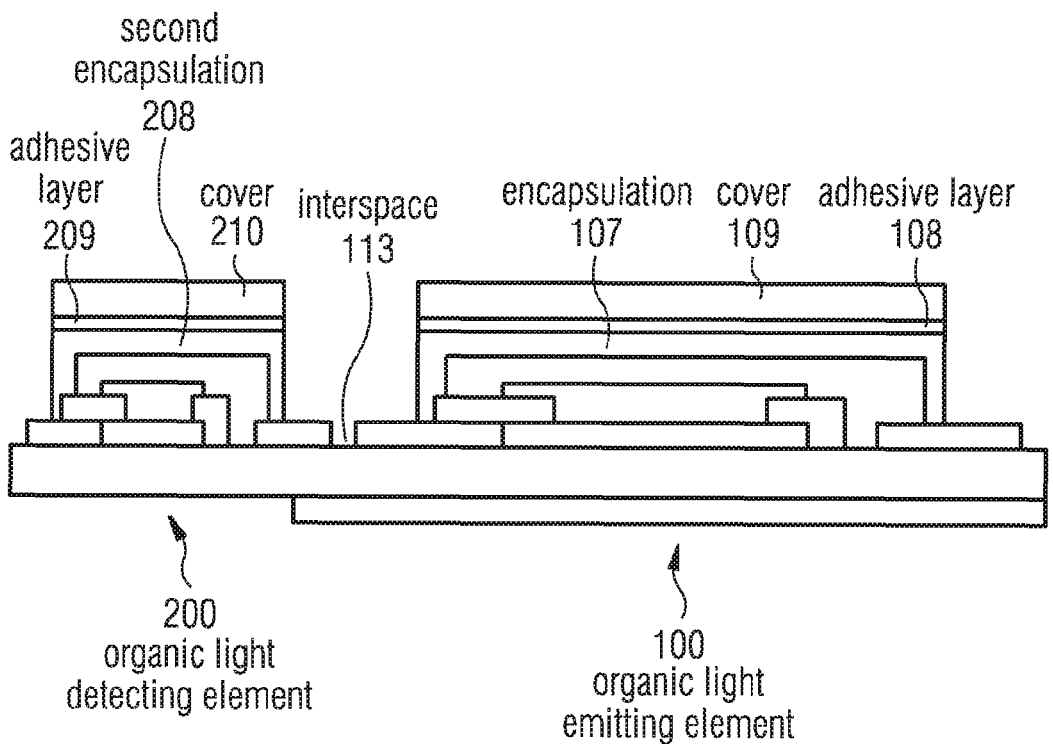

200
organic light
detecting element 100
organic light
emitting element

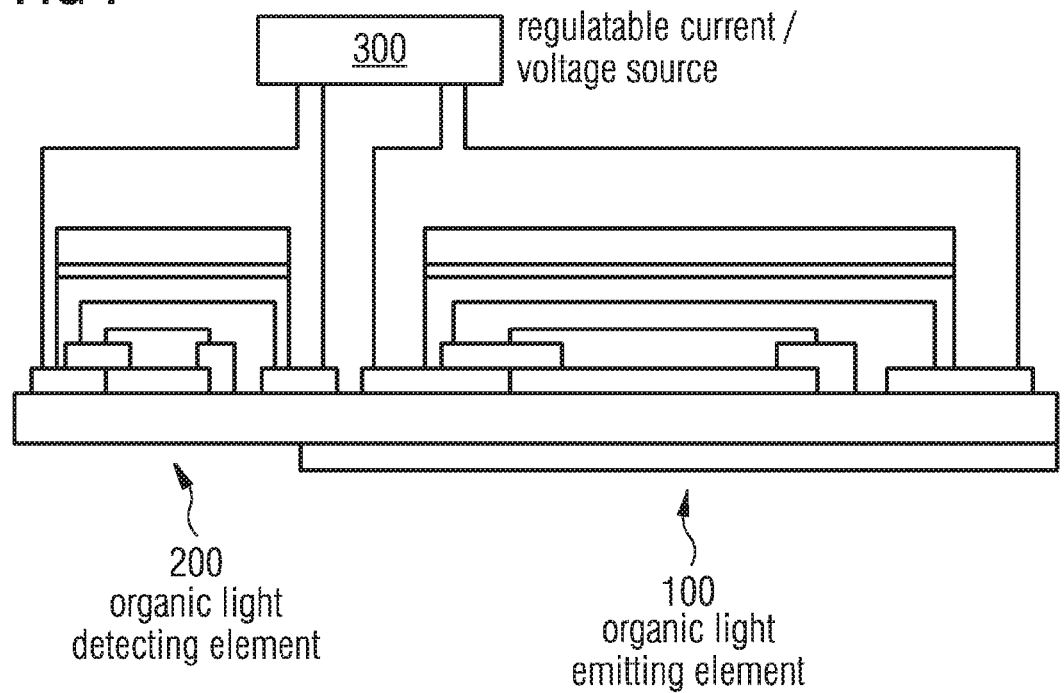
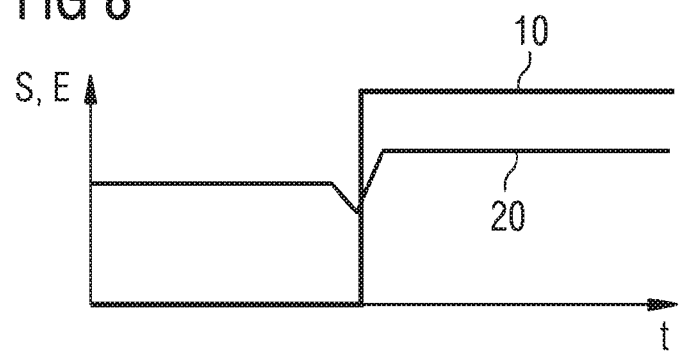
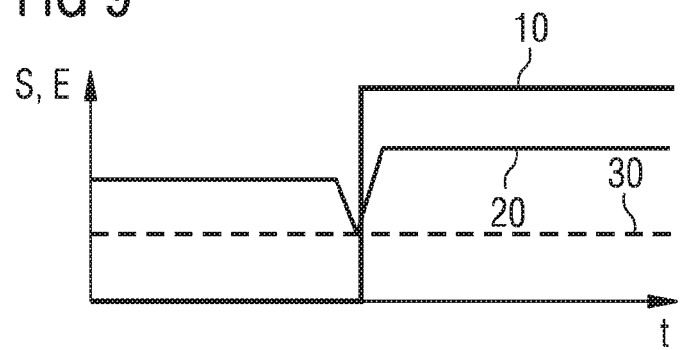

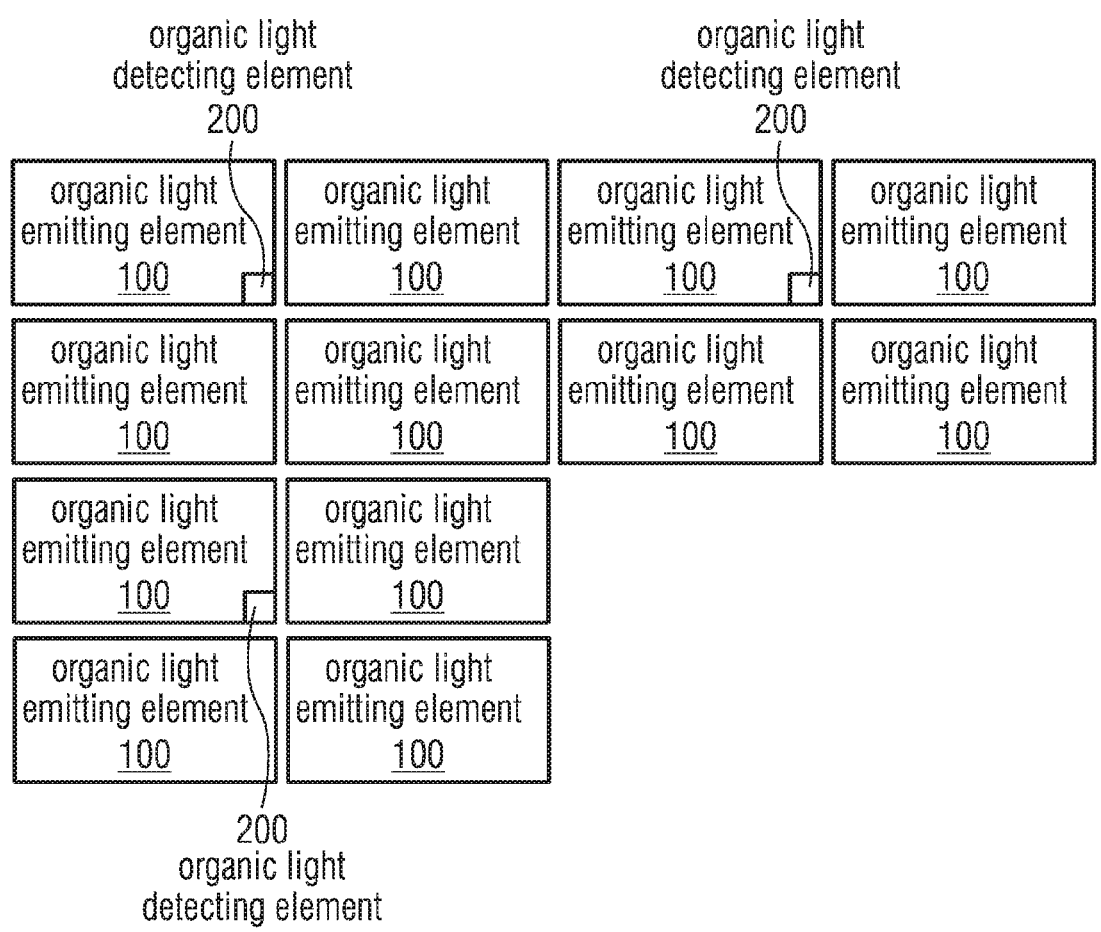

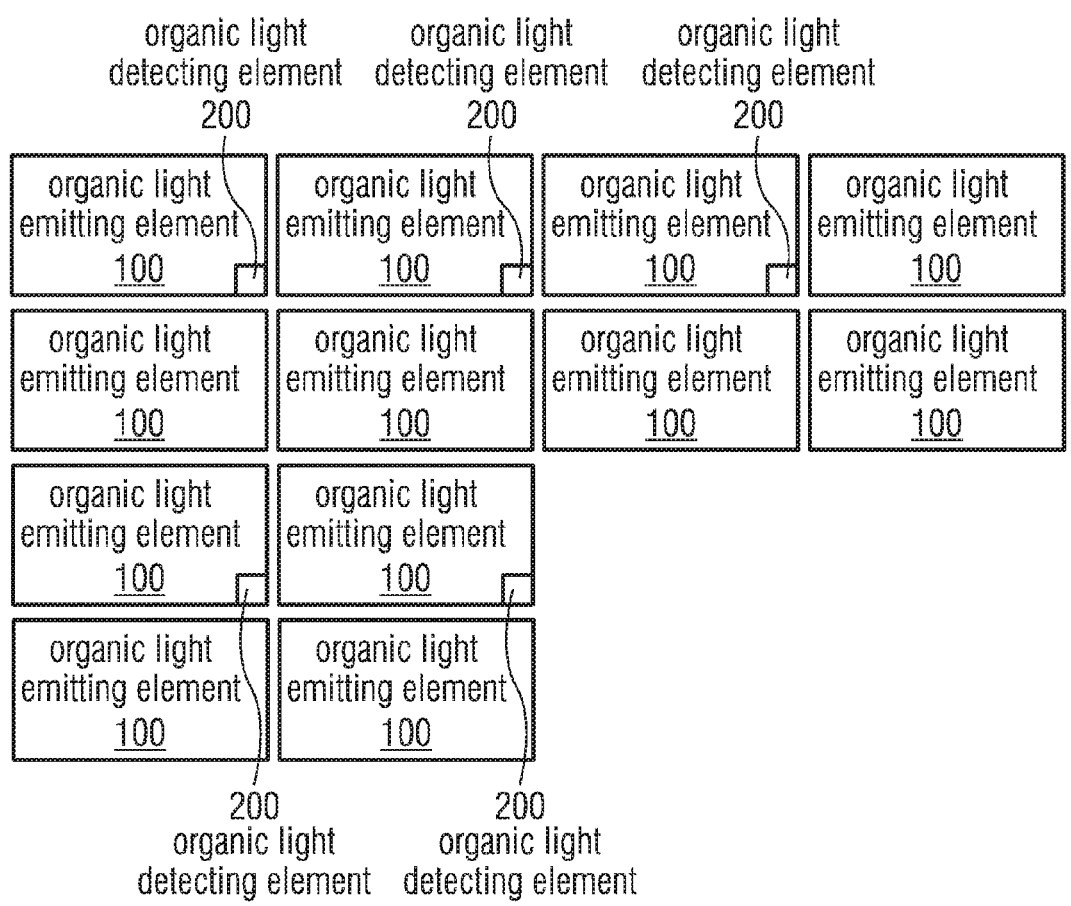

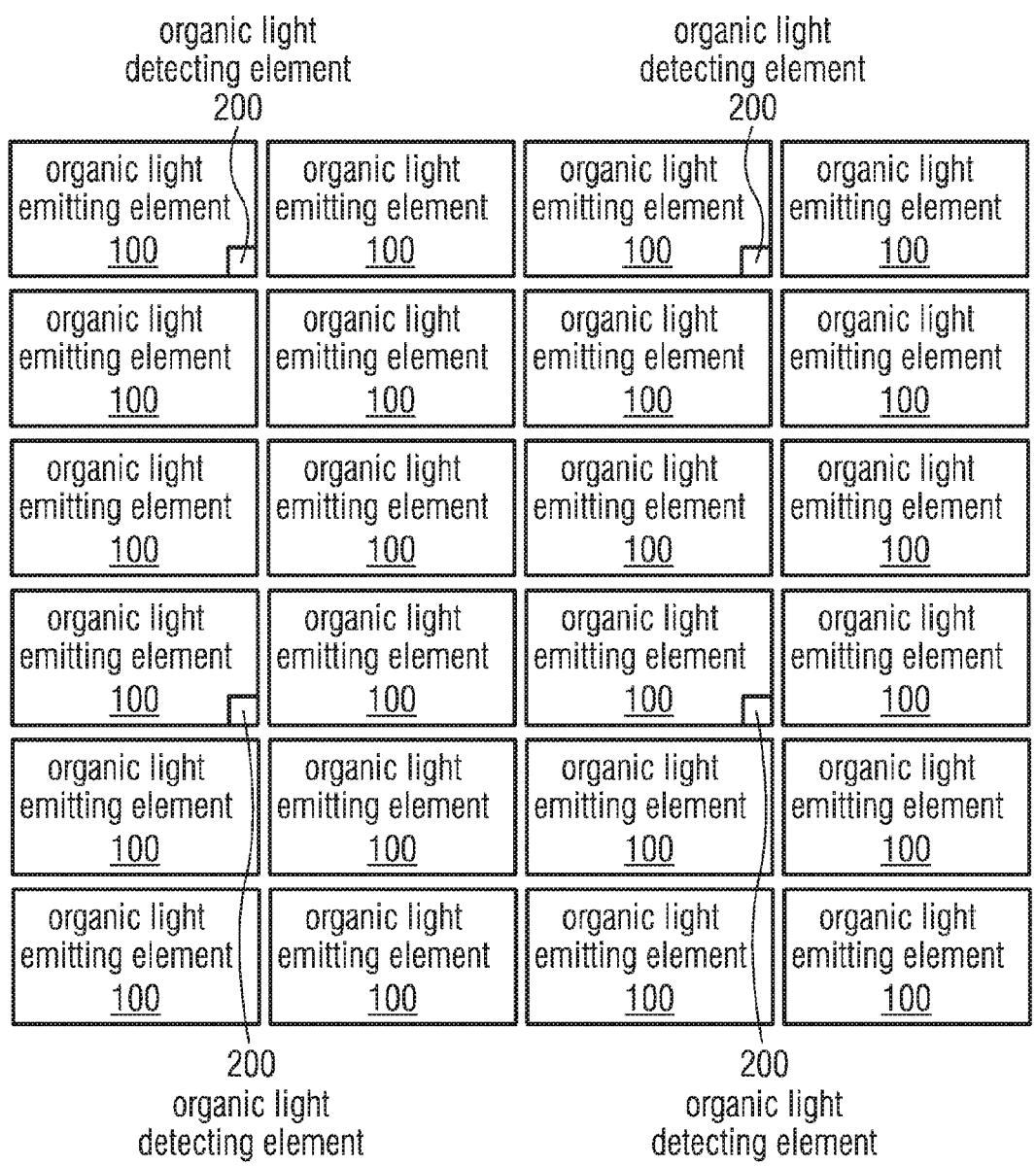

METHOD FOR OPERATING AN ORGANIC OPTOELECTRONIC COMPONENT

CROSS-REFERENCE TO RELATED APPLICATIONS

This patent application is a continuation of U.S. application Ser. No. 14/762,751 filed Jul. 22, 2015, which is a national phase filing under Section 371 of PCT/EP2014/051329, filed Jan. 23, 2014, which claims the priority of German patent application 10 2013 201 212.8, filed Jan. 25, 2013, each of which is incorporated herein by reference in its entirety.

TECHNICAL FIELD

A method for operating an optoelectronic organic component is specified.

BACKGROUND

Luminaries and illuminants can be switched or dimmed by various methods. These include, inter alia, electronic or electrotechnical switches, electronic ballasts and electronic dimmers. Such devices can be operated, for example, mechanically or by changes in capacitances as in the case of touch panels, for example, multitouch panels or capacitive touch panels.

Luminaries can also be switched by optical sensors, pressure sensors, radio sensors or acoustic sensors. However, external sensors, switches and electronic parts are used for this purpose in the prior art. This often necessitates a very complex interconnection between sensors, switches and luminaries since the sensors are independent components.

SUMMARY

Specific embodiments specify a method for operating an organic optoelectronic component.

In accordance with at least one embodiment of a method for operating an organic optoelectronic component, the organic optoelectronic component comprises at least one organic light emitting element comprising an organic functional layer stack having at least one organic light emitting layer between two electrodes. In particular, the at least one organic light emitting element is embodied as organic light emitting diode (OLED) which can emit visible light during operation through at least one of the electrodes. For this purpose, at least one of the electrodes is embodied as transparent.

Here and hereinafter, "transparent" denotes a layer which is transmissive to visible light. In this case, the transparent layer can be clearly translucent or at least partly light scattering and/or partly light absorbing, such that a layer designated as transparent can, for example, be diffusely or milkily translucent. Particularly preferably, a layer designated here as transparent is embodied as transmissive to visible light as far as possible in such a way that in particular the absorption of light generated in the organic light emitting element is as low as possible.

By way of example, a transparent electrode can be composed of a transparent conductive oxide (TCO), graphene, a transparent metal or metallic network structures or can comprise such a material. The other of the two electrodes between which the organic functional layer stack of the organic light emitting element is situated can be embodied as reflective and comprise a metal, for example. As an alternative thereto, it is also possible for both electrodes to be embodied as transparent. In this case, the organic light emitting element can be embodied in particular as a transparent OLED.

The organic optoelectronic component furthermore comprises at least one organic light detecting element comprising at least one organic light detecting layer. In particular, the at least one organic light detecting element can be designed to convert light incident on the at least one organic light detecting layer into an electrically measurable signal, for instance a voltage, a current or an electrical resistance. Hereinafter, the electrically measurable signal of the organic light detecting element is designated simply as signal of the organic light detecting element.

Furthermore, the organic optoelectronic component comprises a common substrate for the at least one organic light emitting element and the at least one organic light detecting element, which are arranged in particular on the common substrate in laterally adjacent area regions. The common substrate can be in particular the sole substrate of the organic optoelectronic component. The functional layer stacks and the electrodes of the organic light emitting and light detecting elements of the organic optoelectronic component are in this case applied successively in particular on the common substrate, such that the common substrate is that substrate which is necessary and provided for producing the organic light emitting and light detecting elements. In other words, the organic light emitting and light detecting elements are not produced on dedicated substrates and then arranged on the common substrate, but rather are produced on the common substrate. Consequently, in this case, no further substrate is arranged in particular between the common substrate and the organic functional layers of the organic light emitting and light detecting elements.

Here and hereinafter, "lateral" denotes a direction parallel to the main extension plane of the common substrate. A lateral direction is thus directed, for example, perpendicularly to the stacking direction of the electrodes and of the organic functional layer stack of the at least one organic light emitting element.

In particular, the at least one organic light emitting element and the at least one organic light detecting element are arranged on the same side of the common substrate. Particularly preferably, with regard to further optoelectronic elements, that is to say further light emitting or light detecting elements, which can be arranged on the common substrate, the at least one organic light detecting element can be directly adjacent to the at least one organic light emitting element, that is to say that no further organic light emitting or light detecting elements are present in a lateral direction between the at least one organic light detecting element and the at least one organic light emitting element.

In accordance with a further embodiment, the at least one organic light detecting element is embodied and usable as organic photodiode. The organic photodiode can comprise in particular an organic functional layer stack between two electrodes, wherein the organic functional layer stack has as organic light detecting layer of the organic light detecting element at least one pn junction for generating charge carriers. By way of example, the organic photodiode, with regard to the electrodes and the organic functional layer stack, can have the same construction as the at least one organic light emitting element and can be operated inversely with respect to the at least one organic light emitting element, that is to say with opposite electrical polarity, as a result of which it may be possible that the manufacture of the organic optoelectronic component causes no or hardly any additional costs in comparison with an exclusively light emitting component. As an alternative thereto, the organic photodiode, in comparison with the organic light emitting element, can comprise other materials and/or other layer constructions with regard to the electrodes and/or the organic functional layer stack, as a result of which, although an additional outlay may be necessary during manufacture, the sensitivity of the at least one organic light detecting element can be adapted in a targeted manner.

In accordance with a further embodiment, the at least one organic light detecting element is embodied and usable as organic photoconductor comprising an organic photoconductive material as organic light detecting layer, which material generates electrical charges upon irradiation by light. Organic photoconductive materials can be embodied, for example, in one layer on an electrically conductive layer, for example, an electrode. Furthermore, organic photoconductive materials can be embodied, for example, in at least two layers comprising at least one organic layer which generates charge carriers and an organic layer which transports charge carriers. Furthermore, an organic light detecting element embodied as an organic photoconductor can have the same construction as the at least one organic light emitting element.

Depending on the materials and construction of the at least one organic light detecting element, the latter can also be constructed simultaneously as photoconductor and photodiode. Such an organic light detecting element can be usable as photodiode with an electrical bias voltage and as photoconductor without an electrical bias voltage.

Furthermore, depending on the materials and construction used, the electrical resistance of the at least one organic light detecting element can be measured, such that the at least one organic light detecting element can be embodied and usable as organic photoresistor.

In particular, it may be advantageous, as described above, if the at least one organic light detecting element and the at least one organic light emitting element have an identical construction. Furthermore, it may be possible for the organic light detecting element to comprise only n- or p-conducting layers or an optoelectronic layer and for these to be identical to the corresponding layers of the organic light emitting element.

The at least one organic light emitting element and the at least one organic light detecting element, with regard to their respective electrodes and organic functional layers, are preferably embodied in a manner electrically isolated from one another on the substrate. In other words, the at least one organic light detecting element covers an area region on the common substrate which is spatially separated from the area region covered by the at least one organic light emitting element on the common substrate. As an alternative thereto, depending on the electrical driving of the organic light emitting element and of the organic light detecting element, it may be possible for these to have a common electrode.

In accordance with a further embodiment, the at least one organic light detecting element, with regard to its area occupation on the common substrate, is embodied as smaller than the at least one organic light emitting element. In particular, the at least one organic light detecting element can cover on the common substrate an area which is less than or equal to ten percent or less than or equal to five percent or less than or equal to one percent of the area covered by the at least one organic light emitting element on the common substrate. In other words, the majority of the common substrate can be covered with the at least one organic light emitting element or, if appropriate, with a plurality of organic light emitting elements, while the at least one organic light detecting element or, if appropriate, a plurality of organic light detecting elements occupy only a small area region, such that the organic optoelectronic component has during operation a luminous area which can substantially correspond to the total area of the common substrate.

In accordance with a further embodiment, the at least one organic light detecting element detects ambient light during the operation of the organic optoelectronic component. In particular, the at least one organic light detecting element is designed to detect ambient light. Here and hereinafter, "ambient light" denotes light which can impinge from outside on the at least one organic light detecting element, that is to say which is not guided within the organic optoelectronic component by means of internal scattering or light guiding effects from the at least one organic light emitting element to the at least one organic light detecting element. The ambient light can comprise, in particular, light which is emitted by the organic light emitting element to the surroundings and is reflected externally. Furthermore, the ambient light can comprise light from other light sources.

In accordance with a further embodiment, the intensity of the light emitted by the at least one organic light emitting element is regulated depending on a signal of the at least one organic light detecting element. In particular, the intensity can be regulated depending on a signal with a characteristic signal waveform. In other words, the characteristic signal waveform of the signal of the at least one organic light detecting element can initiate a regulating event.

Regulating the intensity of the light emitted by the at least one organic light emitting element and a regulating event are understood to mean, in particular, switching and/or dimming. In other words, depending on the signal of the at least one organic light detecting element, the light intensity of the at least one organic light emitting element can be regulated in steps or quasi-continuously in small, for example, infinitesimally small, steps or continuously and thus in a continuously variable fashion. Depending on embodiment and application, this can include both regulation between two brightnesses for increasing or decreasing the emitted intensity and switching the at least one organic light emitting element off or on.

A characteristic signal waveform of the signal of the at least one organic light detecting element is understood to mean, in particular, a specific, preselected temporal change in the signal which initiates a regulating event for regulating the at least one organic light emitting element. In particular, this can involve, for example, a reduction of the signal by a specific value. Furthermore, a reduction of the signal with a subsequent increase in the signal can be involved. In a temporal profile as characteristic signal waveform, such a signal can have a negative peak, that is to say a short dip in the signal strength, which is substantially provided by a fall and a subsequent rise in the signal strength. Furthermore, the characteristic signal waveform can be formed by a fall in the signal strength, a subsequent longer, for example, constant, low signal strength and a subsequent increase in the signal strength.

After the occurrence of the characteristic signal waveform, the signal can have a strength corresponding to the strength beforehand. Furthermore, the signal, for example, as a result of a change in the ambient light as a result of the organic light emitting element and/or as a result of internally guided light such as for the embodiment which is described further below and wherein the at least one organic light detecting element additionally detects light guided internally from the organic light emitting element to the organic light detecting element, after the occurrence of the characteristic signal waveform, can have a lower or higher strength than beforehand, depending on whether the light intensity of the organic light emitting element is regulated downward or upward on the basis of the characteristic signal waveform.

A negative peak can be generated, for example, by an external object being swiped past the at least one organic light detecting element. Here and hereinafter "swiping past" can mean that the external object does not touch the light detecting element for the generation of the characteristic signal waveform. In particular, it is possible to generate the characteristic signal waveform as a result of the movement of the external object at a distance from the light detecting element. The distance can be in this case at least 1 cm, preferably at least 4 cm and particularly preferably at least 8 cm. In other words, during swiping past, a significant distance between the external object and the light detecting element is maintained and no almost touching takes place. This makes it possible, for example, to generate a signal even when an optoelectronic component is otherwise spatially inaccessible, such as, for example, an optoelectronic component fitted to a ceiling of a room. In this case, the distance is, for example, at most 1 m, in particular at most 50 cm.

A fall in the signal strength or a fall, a subsequent longer low signal strength and a subsequent increase in the signal strength can be generated, for example, by the at least one organic light detecting element being at least partly covered with an external object.

In particular, the light emitted by the at least one organic light emitting element can thus be regulated with regard to its intensity by an external object which is moved relative to the at least one organic light detecting element such that a reduction in the signal of the organic light detecting element is brought about. The external object can be, for example, a body part of an external observer or user of the organic optoelectronic component, preferably for instance a hand, one or more fingers or a foot. Furthermore, the external object can be a control element such as, for example, a stylus or a planar object which can be used by an external user for regulating purposes.

The characteristic signal waveform is dependent on the design of the at least one organic light detecting element, that is to say on the latter's size, construction, contacting, orientation and arrangement in the organic optoelectronic component. Furthermore, the characteristic signal waveform can be dependent on the ambient brightness, the intensity of the light emitted by the at least one organic light emitting element, the swiping speed, the covering and uncovering speed and the covered area. In this case, reactions to edges and/or absolute values of the signal and in particular of the characteristic signal waveform are possible for regulating purposes. In particular, reactions to relative and/or absolute signal changes, for example, relative to a reference point such as a zero line, are possible.

In accordance with a further embodiment the intensity of the light emitted by the at least one organic light emitting element is regulated if the signal with the characteristic signal waveform falls below a limit value. As a result, for example, the influence of small disturbances can be reduced and it is possible to define a specific minimum signal change for regulating purposes.

The signal of the at least one organic light detecting element can be processed further in an electronic circuit, which can be formed by an external electronic component or which, as a monolithic element, can form a part of the organic optoelectronic component. The intensity of the light emitted by the organic light emitting element can be controlled in a desired manner by the electronic circuit.

By way of example, the organic optoelectronic component can comprise an electronic component, for example, a regulatable current and/or voltage source, which electronic component measures the light which is detected by the at least one organic light detecting element and which comprises ambient light, and regulates the at least one organic light emitting element depending on the measurement. The fact that the electronic component measures the light detected by the at least one organic light detecting element means, in particular, that the electronic component measures the electronically measurable signal of the at least one organic light detecting element and can detect and evaluate the characteristic signal waveform.

By way of example, the electronic component, that is to say, for example, a regulatable current and/or voltage source, can be at least partly integrated into the organic optoelectronic component. In other words, the regulatable current and/or voltage source can be formed by an electronic component which is embodied as a hybrid or monolithic electronic circuit which can be integrated in the common substrate, for example, or which can be embodied in the form of additional functional layers on the common substrate. By way of example, for this purpose, the common substrate can comprise at least partly an integrated circuit on the basis of a semiconductor material, for example, silicon and/or printed electronics. As an alternative thereto, it may be possible for the electronic component, that is to say, for example, the regulatable current and/or voltage source, to be embodied as an external electronic component which is interconnected with the organic optoelectronic component by means of suitable electrical connections such as, for instance, conductor tracks and/or wire connections.

Furthermore, it may be possible for the at least one organic light emitting element and the at least one organic light detecting element to be interconnected separately from one another. For this purpose, the at least one organic light emitting element can be connected to an electronic component in the form of a current and/or voltage source, while the at least one organic light detecting element is connected to an electronic component in the form of a current and/or voltage and/or resistance measuring instrument.

As a result of the monolithic integration of the at least one organic light detecting element, which can have, for example, the same layer construction as the at least one organic light emitting element, on a preferably small, separated area region of the common substrate, in addition to the at least one organic light emitting element a sensor element can be integrated with low complexity in the organic optoelectronic component described here. As a result, it is possible to achieve an unchanged process control during production in comparison with conventional surface emitters without additional complexity and without additional costs which would be incurred as a result of a separate sensor.

Depending on the intensity of the light incident on the organic light detecting element, the light being composed of the sum of all incident light sources, an electrically measurable signal such as, for instance, a photovoltage, a photocurrent or a resistance change is generated which, in terms of absolute value, turns out to be all the higher, the higher the incident light intensity. The sum of all incident light sources can be formed, for example, by scattered light of the light emitted by the at least one organic light emitting element during operation, the scattered light being guided internally in the organic optoelectronic component, by externally reflected light, by light from other light sources, and combinations thereof. The changes in the electrical properties of the organic light detecting element can be used to obtain, in an electronic circuit, switching and/or dimming as a result of the signal of the organic light detecting element being fed back to the organic light emitting element, wherein the detector in the form of the at least one organic light detecting element is monolithically integrated into the luminous area of the organic optoelectronic component. As a result, an external user of the organic optoelectronic component can achieve an accurate adaptation of the radiation power of the organic optoelectronic component, preferably embodied as surface light element, to external conditions, for example, according to the user's desire, which can lead to an energy saving, for example. Furthermore, a new functionality in the operational control and haptics, for example, by means of switching or dimmer by swiping movement is achieved in the case of the organic optoelectronic component described here.

In accordance with a further embodiment the at least one organic light detecting element is designed to detect ambient light through the common substrate. In this case, the common substrate is particularly preferably embodied as transparent and can comprise, for example, glass and/or a transparent plastic or be composed thereof. By way of example, the common substrate can be embodied in the form of a glass plate or glass layer or in the form of a plastic plate, plastic layer or plastic film or in the form of a glass-plastic laminate comprising at least one glass layer and at least one plastic layer.

If the at least one organic light detecting element has an electrode between the at least one organic light detecting layer and the common substrate, then the electrode, in the case of ambient light detection through the substrate, is likewise embodied as transparent or has at least one light-transmissive region. This can mean that the electrode is embodied as a ring contact, for example. Here and hereinafter, "ring contact" denotes any form of an electrode which has an opening enclosed completely or only partly by electrode material in a lateral direction. In particular, a U-shaped electrode, for example, can also come under the term ring contact.

In accordance with at least one further embodiment, the at least one organic light detecting element is designed to detect ambient light which is radiated onto the organic optoelectronic component from the opposite side of the organic optoelectronic component relative to the substrate. In this case, the common substrate, depending on the emission direction of the organic light emitting element, can be embodied as transparent, non-transparent at least in the region of the organic light detecting element or completely non-transparent. If the at least one organic light detecting element has an electrode on that side of the organic light detecting layer which faces away from the substrate, then the electrode is preferably embodied as transparent or as a ring contact. If the organic optoelectronic component has an encapsulation and/or a cover on the side facing away from the common substrate at least in the region of the organic light detecting element, then the encapsulation and/or the cover are/is likewise embodied as transparent in this case.

In accordance with a further embodiment, the at least one organic light emitting element is designed to emit light on an emission side of the organic optoelectronic component. An emission side, which denotes that side or those sides on which the organic optoelectronic component emits light, can be formed, for example, by the side on which, as viewed from the at least one organic light emitting layer of the at least one organic light emitting element, the common substrate is arranged. In this case, in which the common substrate is preferably embodied as transparent, the at least one organic light emitting element and also the organic optoelectronic component are designated as a "bottom emitter". Furthermore, it is possible for an emission side, as viewed from the at least one organic light emitting layer, to be arranged on the opposite side of the organic optoelectronic component relative to the common substrate. In this case, the at least one organic light emitting element and also the organic optoelectronic component can be embodied as a "top emitter". If the organic optoelectronic component is embodied simultaneously as a bottom emitter and as a top emitter, it can preferably be embodied as a transparent organic optoelectronic component having two emission sides.

In accordance with a further embodiment, the at least one organic light detecting element is designed to detect ambient light which is radiated onto the organic optoelectronic component on a different side than an emission side of the organic optoelectronic component, such that an emission side of the organic optoelectronic component and a detection side of the at least one organic light detecting element are different. Therefore, the emission side and the operating side, that is to say the side via which the organic optoelectronic component is regulated, differ from one another. If the organic optoelectronic component emits, for example, in the direction facing away from the common substrate, that is to say if the organic optoelectronic component has a top emitter configuration, this means that the at least one organic light detecting element can detect ambient light through the common substrate. By contrast, if the organic optoelectronic component is embodied as a bottom emitter, this means that the at least one organic light detecting element is designed to detect ambient light from the opposite side of the organic optoelectronic component relative to the substrate.

In accordance with a further embodiment, the organic light detecting element is designed to detect ambient light which is radiated onto the organic optoelectronic component on the emission side. In other words, a detection side of the at least one organic light detecting element in this case corresponds to an emission side of the at least one organic light emitting element, such that the operational control for regulating the organic optoelectronic component is carried out on the emission side.

In accordance with a further embodiment the organic optoelectronic component comprises a plurality of organic light detecting elements. This means that a plurality of organic light detecting elements are arranged on the common substrate. In particular, the plurality of the organic light detecting elements and the at least one organic light emitting element are arranged on the same side of the common substrate. By means of a plurality of organic light detecting elements, for example, ambient light can be detected at different positions of the organic optoelectronic component.

In accordance with a further embodiment the intensity of the light emitted by the at least one organic light emitting element is regulated depending on a temporal succession of at least two signals from at least two organic light detecting elements, wherein each of the signals has a characteristic signal waveform. By way of example, the characteristic signal waveform of each of the at least two signals can be a negative peak, wherein the negative peaks take place temporally successively. In this embodiment, therefore, a desired regulating event is initiated only if the characteristic signal waveforms are detected successively. The temporally successive negative peaks in the signals from at least two organic light detecting elements can be generated, for example, by an external object being swiped past the at least two organic light detecting elements successively and in particular in a single movement. For this purpose, the at least two organic light detecting elements can be organic light detecting elements that are adjacent to one another. That means that no further organic light detecting element is arranged between the at least two organic light detecting elements. Depending on the order of the temporally successive characteristic signal waveforms, which order can be determined by the swiping direction, an increase or decrease in the emitted light intensity can be brought about, for example.

Furthermore, it may be possible for a first signal to be generated by one of the plurality of organic light detecting elements being at least partly covered with an external object, and a second signal to be generated by another of the plurality of organic light detecting elements being covered with an external object. In this case, the same external object or different external objects can be used. In this embodiment, therefore, a regulating event is brought about only if the at least two organic light detecting elements are covered successively. Furthermore, it may be possible for a first signal to be generated by one of the plurality of organic light detecting elements being covered with an external object and a second signal to be generated by an external object being swiped past another of the at least two organic light detecting elements. In these embodiments, therefore, the first signal of a first organic light detecting element serves as a trigger for a detection of a possible second signal of a second organic light detecting element, wherein it may be necessary, for example, for the first and second signals to overlap temporally, that is to say for both organic light detecting elements to be covered simultaneously for instance for a certain time.

In accordance with a further embodiment the at least one organic light detecting element detects, in addition to the ambient light, light which is emitted by the at least one organic light emitting element and which is guided internally in the organic optoelectronic component to the at least one organic light detecting element. As a result, a direct internal feedback of the emitted light to the sensor signal can be achieved, which can result in further regulating possibilities.

In accordance with a further embodiment the intensity of the light emitted by a plurality of organic light emitting elements is regulated depending on the signal of the at least one organic light detecting element. By way of example, for this purpose, a plurality of organic light emitting elements can be arranged on the common substrate. In particular, the plurality of the organic light emitting elements and the at least one organic light detecting element or a plurality of organic light detecting elements can all be arranged on the same side of the common substrate.

Furthermore, it is possible that the organic light emitting elements of the plurality of organic light emitting elements are regulatable separately from one another and each of the organic light emitting elements is assigned an organic light detecting element, such that the individual organic light emitting elements can be switched on or off independently of one another, for example. As a result, it may be possible for the luminous area of the organic optoelectronic component, the luminous area being formed by the totality of the organic light emitting elements, to be subdivided into functional regions which are formed by the organic light emitting elements and which can be regulated independently of one another and can be controlled with regard to the respectively emitted light power with the aid of the organic light detecting elements. In this case, the organic optoelectronic component can form a macrodisplay, for example.

Furthermore, it may be possible that the at least organic light detecting element or a plurality of organic light detecting elements of the organic optoelectronic component can be used to regulate one or a plurality of external organic light emitting elements which are arranged on dedicated substrates and which are electrically connected to the organic optoelectronic component via electrical wire connections, for example.

The fact that an organic light emitting element is assigned an organic light detecting element means, in particular, that the light detecting element and the light emitting element form a functional unit with regard to the brightness regulation of the light emitting element. Furthermore, it can also mean that the organic light detecting element is closest to the assigned organic light emitting element in comparison with further organic light emitting elements.

BRIEF DESCRIPTION OF THE DRAWINGS

Further advantages, advantageous embodiments and developments will become apparent from the exemplary embodiments described below in association with the figures.

In the figures:

FIG. 1 shows a schematic illustration of an organic light emitting element in accordance with one exemplary embodiment, FIGS. 2A and 2B show schematic illustrations of an organic optoelectronic component and of the light relationships in the case of an organic optoelectronic component in accordance with further exemplary embodiments, FIGS. 3 to 4B show schematic illustrations of organic optoelectronic components in accordance with further exemplary embodiments, and FIGS. 5 to 17C show schematic illustrations of organic optoelectronic components and the operation thereof in accordance with further exemplary embodiments.

Figure 2A:
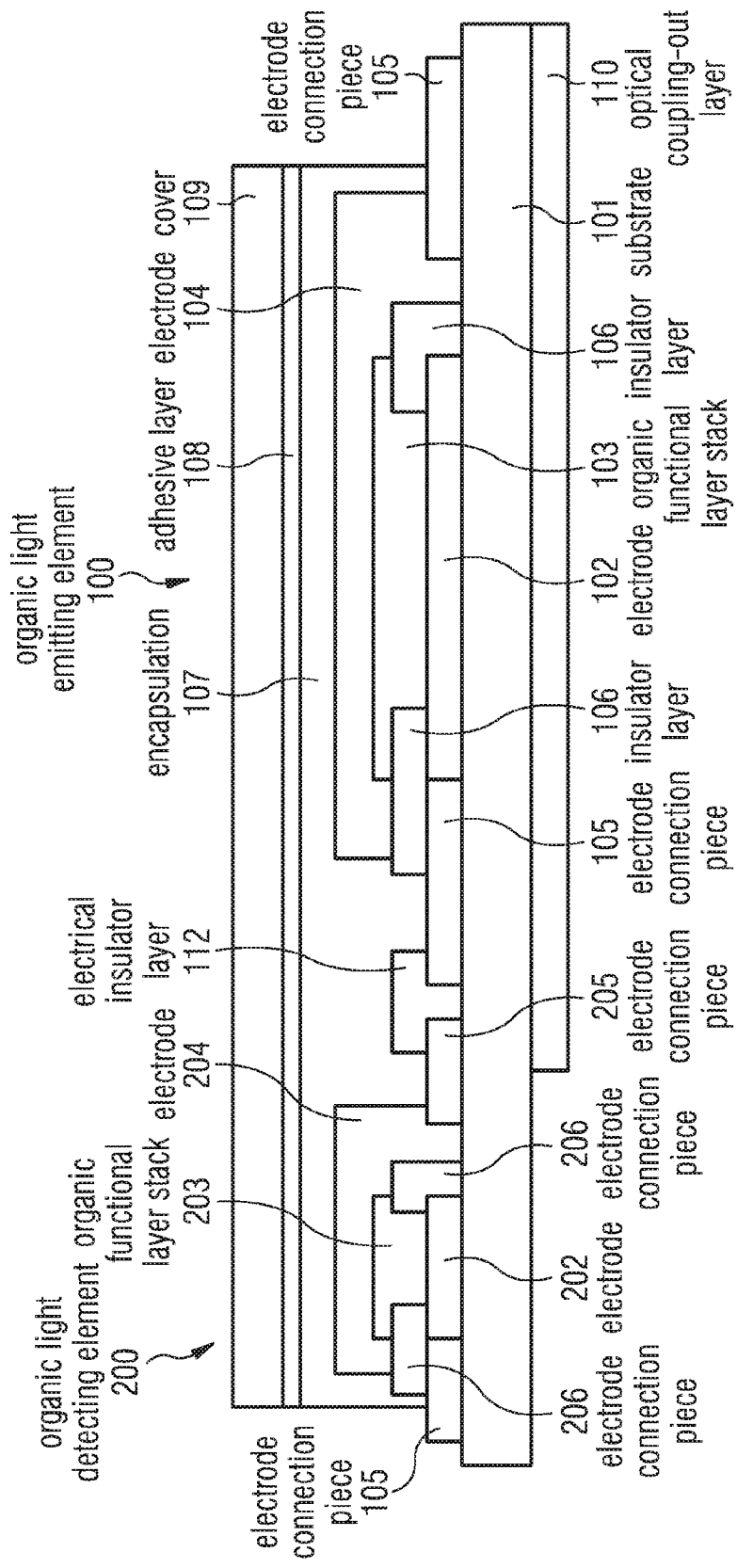

In the exemplary embodiments and figures, elements that are identical, of identical type or act identically may be provided in each case with the same reference signs. The illustrated elements and their size relationships among one another should not be regarded as true to scale; rather, individual elements such as, for example, layers, component parts, components and regions may be illustrated with an exaggerated size in order to enable better illustration and/or in order to afford a better understanding.

DETAILED DESCRIPTION OF ILLUSTRATIVE EMBODIMENTS

FIG. 1 shows, in accordance with one exemplary embodiment, the basic construction of an organic light emitting element 100 embodied as an organic light emitting diode (OLED).

The organic light emitting element 100, which may also be designated as OLED 100 hereinafter, comprises a substrate 101, on which an organic functional layer stack 103 having at least one organic light emitting layer is arranged between electrodes 102 and 104. At least one of the electrodes 102, 104 is embodied as transparent, such that light generated in the organic functional layer stack 103 during the operation of the OLED 100 can be radiated through the at least one transparent electrode.

In the OLED 100 shown in FIG. 1, the substrate 101 is embodied as transparent, for example, in the form of a glass plate or glass layer. As an alternative thereto, the substrate 101 can, for example, also comprise a transparent plastic or a glass-plastic laminate.

The electrode 102 applied on the substrate 101 is likewise embodied as transparent and comprises a transparent conductive oxide, for example. Transparent conductive oxides (TCOs) are transparent conductive materials, generally metal oxides, such as, for example, zinc oxide, tin oxide, cadmium oxide, titanium oxide, indium oxide and indium tin oxide (ITO). Alongside binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped. Furthermore, a transparent electrode can for example also comprise a transparent metal, metallic network structures or conductive networks, for example, comprising or composed of silver, and/or graphene or carbon-containing layers or a combination of the transparent materials mentioned.

In the exemplary embodiment shown, the further electrode 104 on the organic functional layer stack 103 is embodied as reflective and comprises a metal, which can be selected from aluminum, barium, indium, silver, gold, magnesium, calcium and lithium, and compounds, combinations and alloys therewith. In particular, the electrode 104 can comprise Ag, Al or alloys or layer stacks comprising these, for example, Ag/Mg, Ag/Ca, Mg/Al, Ag/Mg—Al or Mo/Al/Mo or Cr/Al/Cr or a layer stack combination comprising the materials mentioned. Alternatively or additionally, the electrode 104 can also comprise an abovementioned TCO material or a layer stack comprising at least one TCO and at least one metal.

In the exemplary embodiment shown, the bottom electrode 102 is embodied as an anode, while the top electrode 104 is embodied as a cathode. With an appropriate choice of materials, however, a construction reversed with respect to the polarity is also possible.

The electrodes 102, 104 are preferably embodied in large-area and continuous fashion, such that the organic light emitting element 100 is shaped as a luminous source, in particular as a surface light source. In this case, "large-area" can mean that the organic light emitting element 100 has an area of greater than or equal to a few square millimeters, preferably greater than or equal to one square centimeter and particularly preferably greater than or equal to one square decimeter. As an alternative thereto, it may also be possible that at least one of the electrodes 102, 104 of the organic light emitting element 100 between which the organic functional layer stack 103 is situated is embodied in a structured fashion, as a result of which a spatially and/or temporally structured and/or variable luminous impression, for example, for structured lighting or for a display device, can be made possible by means of the organic light emitting element 100.

For electrically contacting the electrodes 102 and 104, as is shown in FIG. 1, electrode connection pieces 105 can be provided, which extend through below the encapsulation 107 (described further below) from the electrodes 102, 104 toward the outside. The electrode connection pieces 105 embodied as electrical contact feeds can be embodied as transparent or non-transparent depending on the emission direction of the OLED 100 and can comprise or be composed of a TCO and/or a metal, for example. By way of example, the electrode connection pieces 105 can be formed by a metal layer or a metal layer stack, for example, Mo/Al/Mo, Cr/Al/Cr or Al.

The organic functional layer stack 103 can comprise, in addition to the at least one organic light emitting layer, further organic layers, for example, one or more selected from a hole injection layer, a hole transport layer, an electron blocking layer, a hole blocking layer, an electron transport layer, an electron injection layer and a charge generation layer (CGL), which are suitable for conducting holes or electrons to the organic light emitting layer or for blocking the respective transport. The layers of the organic functional layer stack 103 can comprise organic polymers, organic oligomers, organic monomers, organic small, non-polymeric molecules ("small molecules"), or combinations thereof. In particular, it may be advantageous if the organic functional layer stack 103 comprises a functional layer embodied as a hole transport layer in order to enable an effective injection of holes into the organic light emitting layer. By way of example, tertiary amines, carbazole derivatives, conductive polyaniline or polyethylene dioxythiophene may prove to be advantageous as materials for a hole transport layer. Suitable materials for the light emitting layer include electroluminescent materials which exhibit radiation emission on account of fluorescence or phosphorescence, for example polyfluorene, polythiophene or polyphenylene or derivatives, compounds, mixtures or copolymers thereof.

Furthermore, as shown in FIG. 1, insulator layers 106 can be present, for example, comprising or composed of polyimide, which insulator layers can electrically insulate the electrodes 102, 104 from one another, for example. Depending on the configuration of the individual layers of the OLED 100, insulator layers 106 need not be absolutely necessary and may be absent, for instance in the case of corresponding mask processes for applying the layers.

An encapsulation 107 for protecting the organic functional layer stack 103 and the electrodes 102, 104 is arranged above the organic functional layer stack 103 and the electrodes 102, 104. In this case, the encapsulation 107 is particularly preferably embodied as a thin-film encapsulation.

In the present case, an encapsulation embodied as a thin-film encapsulation is understood to mean a device suitable for forming a barrier with respect to atmospheric substances, in particular with respect to moisture and oxygen and/or with respect to further damaging substances such as, for instance, corrosive gases, for example, hydrogen sulfide. In other words, the thin-film encapsulation is embodied in such a way that at most very small portions of atmospheric substances can penetrate through it. This barrier effect in the case of the thin-film encapsulation is substantially produced by barrier layers and/or passivation layers which are embodied as thin layers and which are part of the encapsulation. The layers of the encapsulation generally have a thickness of less than or equal to a few 100 nm.

In particular, the thin-film encapsulation can comprise or consist of thin layers which are responsible for the barrier effect of the encapsulation. The thin layers can be applied for example by means of an atomic layer deposition (ALD) method or molecular layer deposition (MLD) method. Suitable materials for the layers of the encapsulation arrangement are, for example, aluminum oxide, zinc oxide, zirconium oxide, titanium oxide, hafnium oxide, lanthanum oxide, tantalum oxide. The encapsulation preferably comprises a layer sequence having a plurality of the thin layers, each having a thickness of between one atomic layer and a few 100 nm.

As an alternative or in addition to thin layers produced by means of ALD or MLD, the encapsulation can comprise at least one or a plurality of further layers, that is to say in particular barrier layers and/or passivation layers, which are deposited by thermal vapor deposition or by means of a plasma-assisted process, for instance sputtering, chemical vapor deposition (CVD) or plasma-enhanced chemical vapor deposition (PECVD). Suitable materials therefor may be the abovementioned materials and silicon nitride, silicon oxide, silicon oxynitride, indium tin oxide, indium zinc oxide, aluminum-doped zinc oxide, aluminum oxide, and mixtures and alloys of the materials mentioned. The one or the plurality of further layers can have, for example, in each case a thickness of between 1 nm and 5 µm and preferably between 1 nm and 400 nm, inclusive of the limits.

As an alternative or in addition to a thin-film encapsulation, the encapsulation 107 can also comprise a glass lid which, for example, in the form of a glass substrate having a cavity, is adhesively bonded on the substrate 101 by means of an adhesive layer. Furthermore, a moisture-absorbing substance (getter), for example, composed of zeolite, can be adhesively bonded into the cavity in order to bind moisture, oxygen or other damaging gases which can penetrate through the adhesive. Furthermore, the adhesive layer for fixing the lid on the substrate may also itself be absorbent for damaging substances and/or adhesive layer structures may be present.

Furthermore, as shown in FIG. 1, a cover 109 adhesively bonded by means of an adhesive layer 108 can be arranged on the encapsulation 107, as viewed from the substrate 101. The cover 109, which can be designated as "superstrate" in view of its arrangement in comparison with the substrate 101, can be formed, for example, by a glass layer or glass plate or else a plastic, a metal or a combination or a laminate of the materials mentioned and, in particular in conjunction with an encapsulation 107 embodied as a thin-film encapsulation, can serve as mechanical protection, in particular as anti-scratch protection, without the cover 109 itself having to have an encapsulating effect. Alternatively or additionally, a protective lacquer, for example, in the form of a spray lacquer, can also be applied on the encapsulation 107.

On account of the transparent substrate 101 and the transparent bottom electrode 102, the OLED 100 is embodied as a bottom emitter and emits light through the transparent electrode 102 and the transparent substrate 101 during operation. In order to improve the coupling out of light, as shown in FIG. 1, an optical coupling-out layer no can be arranged on that side of the substrate 101 which faces away from the organic functional layer stack 103, the optical coupling-out layer being embodied, for example, as a scattering layer comprising scattering particles in a transparent matrix and/or having a light-scattering surface structure. It is possible to arrange a coupling-out layer, for example, between the substrate 101 and the bottom electrode 102 arranged on the substrate 101 or between other functional layers in the form of an internal coupling-out layer.

As an alternative to the bottom emitter configuration described, the top electrode 104 arranged in a manner facing away from the substrate 101 can also be embodied as transparent, in order that the light generated in the organic functional layer stack 103 during operation is emitted through the top electrode 104 in a direction facing away from the substrate 101. In this case, the OLED 100 is embodied as a top emitter. The bottom electrode 102 arranged between the substrate 101 and the organic functional layer stack 103 can be embodied as reflective, if light emission through the substrate 101 is not desired. Likewise, in this case, the substrate 101 can comprise a non-transparent material, for example, a non-transparent glass, a non-transparent plastic, a metal or combinations thereof. In addition to the top electrode 104, in the top emitter configuration the encapsulation 107 and, if present, the adhesive layer 108 and the cover 109 are also embodied as transparent. Furthermore, in this case, a coupling-out layer can be arranged above the top electrode 104, for example, on the cover 109 or between the cover 109 and the encapsulation 107.

Furthermore, the OLED 100 can be embodied simultaneously as a bottom emitter and as a top emitter and thus preferably as a transparent OLED and can have a combination of the features respectively mentioned in association with the bottom and top emitter configurations.

With regard to further features of the organic light emitting element 100, for example, with regard to the construction, the layer composition and the materials of the organic functional layer stack, of the electrodes and of the encapsulation, reference is made to the document WO 2010/066245 A1, which is hereby expressly incorporated by reference with regard to the construction of an organic light emitting component and also with regard to modifications and variations of the organic light emitting element shown in FIG. 1.

The exemplary embodiments shown hereinafter have in each case an organic light emitting element 100 which may be embodied in accordance with the exemplary embodiment in FIG. 1 or which may have modifications or variations with respect thereto. In particular, the features of the basic construction of the organic light emitting element 100 as shown in FIG. 1 should not be understood to be restrictive for the following exemplary embodiments.

In the text hereinafter, firstly some exemplary embodiments of various designs for an organic optoelectronic component are described. Afterward, exemplary embodiments of methods for operating the organic optoelectronic component are described, which apply to all the designs described.

FIG. 2A shows an organic optoelectronic component in accordance with one exemplary embodiment, comprising alongside an organic light emitting element 100 an organic light detecting element 200. The organic light detecting element 200 is arranged together with the organic light emitting element 100 on the substrate 101, such that the substrate 101 forms a common substrate for the organic light emitting element 100 and the organic light detecting element 200. In particular, the organic light emitting element 100 and the organic light detecting element 200 are arranged on the same side of the common substrate 101 in laterally adjacent area regions.

In the exemplary embodiment shown, the organic light detecting element 200 is embodied and usable as organic photodiode. The organic light detecting element 200 comprises an organic functional layer stack 203 between two electrodes 202, 204, wherein the organic functional layer stack 203 has at least one organic light detecting layer. In the exemplary embodiment shown, the at least one organic light detecting layer is embodied as a pn junction for generating charge carriers.

In particular, the organic light detecting element 200, in the exemplary embodiment shown, with regard to the electrodes 202, 204 and the organic functional layer stack 203 has the same construction as the organic light emitting element 100 with regard to the electrodes 102, 104 and the organic functional layer stack 103 and can be operated inversely with respect to the organic light emitting element 100, that is to say with opposite electrical polarity. As a result, the manufacture of the organic optoelectronic component shown may cause no or only low additional costs in comparison with an exclusively light emitting component. As an alternative thereto, the organic light detecting element 200, in comparison with the organic light emitting element 100, may comprise different materials and/or different layer constructions with regard to the electrodes 202, 204 and/or the organic functional layer stack 203.

The organic optoelectronic component furthermore comprises an encapsulation 107, which is embodied as a thin-film encapsulation and which forms a common encapsulation for the organic light emitting element 100 and the organic light detecting element 200. In other words, the encapsulation 107 extends with large area and continuously over the functional layers of the organic light emitting element 100 and of the organic light detecting element 200. A common cover 109 is fixed on the common encapsulation 107 by means of an adhesive layer 108.

Furthermore, electrode connection pieces 205 are present, which serve for electrically contacting the electrodes 202, 204 and which can be embodied like the electrode connection pieces 105 of the organic light emitting element 100. The electrode connection pieces 105, 205 extend from the elements 100, 200, out of the encapsulation 107, such that the elements 100, 200 can be contacted externally.

An electrical insulator layer 112 is arranged between the organic light emitting element 100 and the organic light detecting element 200 directly on the substrate 101, the electrical insulator layer being covered by the common encapsulation 107. The electrical insulator layer 112, which can comprise or be composed of polyimide or some other electrically insulating material, for example, serves for electrically insulating the organic light detecting element 200 from the organic light emitting element 100, such that the electrode connection pieces 105, 205 of the elements 100, 200 can be arranged at a small distance from one another on the common substrate 101, without the occurrence of an electrical crosstalk between the elements 100, 200.

FIG. 2B indicates the light relationships during operation for the organic optoelectronic component from FIG. 2A. In FIG. 2B and also in the subsequent figures, the reference signs of the individual layers and parts of the organic optoelectronic component respectively shown are depicted primarily simply with regard to differences with respect to the previously described exemplary embodiments, for the sake of clarity.

The organic light emitting element 100 in FIGS. 2A and 2B and thus the organic optoelectronic component shown, in the exemplary embodiment shown, is embodied merely by way of example as a bottom emitter and during operation emits light 1 through the common substrate and the electrode embodied as transparent that is arranged between the organic functional layer stack and the common substrate. The substrate side of the organic optoelectronic component thus forms the emission side. Through the transparent substrate, part of the light generated by the organic light emitting element 100 is guided to the organic light detecting element 200 on account of scattering and waveguiding effects, as indicated by the reference sign 2. Furthermore, depending on the embodiment of the electrodes and insulator layers it may be possible for light to pass from the organic light emitting element 100 to the organic light detecting element 200 through the common encapsulation.

By means of a targeted adaptation of the distance between the organic light emitting element 100 and the organic light detecting element 200 and in this case in particular with regard to an absorption in the common substrate, by means of a suitable arrangement of one or a plurality of coupling-out layers on one or both sides of the common substrate, by means of a suitable choice of materials with regard to the electrodes, the insulator layers and the encapsulation, for example, with regard to a suitable refractive index for avoiding total internal reflection in the substrate or the cover, and by means of suitable substrate materials which are non-transparent at least in places, in particular, for example, in the case of an embodiment of the organic light emitting element 100 as a top emitter, the light 2 guided internally from the organic light emitting element 100 to the organic light detecting element 200 can be reduced or completely suppressed.

A complete suppression or at least a greatest possible reduction of the internally guided light 2 may be desirable and advantageous in particular if the intention is for only ambient light, that is to say external light, to be detected by the organic light detecting element 200. Depending on the arrangement and embodiment of the organic optoelectronic component, the ambient light can be radiated onto the organic optoelectronic component and thus onto the organic light detecting element 200 on the substrate side, indicated by the reference signs 3, and/or on the side of the cover, indicated by the reference signs 4. The ambient light 3, 4 can be, for example, light from other natural or artificial light sources or light 1 from the organic optoelectronic component which is reflected back onto the organic light detecting element 200 by external reflection.

The light 3, 4 incident on the organic light detecting element 200 on the front or rear side, that is to say on the substrate side or the cover side of the organic optoelectronic component and thus on the emission side or the opposite side relative to the emission side, can be influenced by the choice of materials situated between the surroundings and the organic functional layer stack of the organic light detecting element 200. By way of example, the coupling of ambient light 3, 4 into the organic light detecting element 200 can be influenced by an arrangement of a coupling-out layer on one side of the organic light detecting element 200.

Measurements with test set-ups that comprise an organic light emitting element having a luminous area of approximately 2 cm$^2$, an operating voltage of 6.5 V and a luminance of approximately 2500 cd/m$^2$ showed, as a result of a variation of the areas of an organic light emitting element and of an organic light detecting element and also as a result of variation of the distance and the lateral offset between the organic light emitting element and the organic light detecting element, that in the case of an organic photodiode as organic light detecting element the photovoltage is all the greater, the larger the area of the organic light detecting element, while the photovoltage is all the lower, the larger the distance and the larger the offset between the organic light emitting element and the organic light detecting element. Typical distances between the organic light emitting element and the organic light detecting element were in the range of from 5 mm to 75 mm, for example, 5 mm, 20 mm and 75 mm, and a typical detector size for the organic light detecting element had a diameter of approximately 4 mm.

FIGS. 3 to 4B show further variations and modifications of the organic optoelectronic component in accordance with the exemplary embodiment in FIGS. 2A and 2B which exhibit, inter alia, variation possibilities in terms of construction and for light detection. By way of example, it is possible to vary the type of the organic light detecting element with regard to the construction and the functioning and/or the electrical circuitry, the number of organic light detecting elements, the position of one or more organic light detecting elements in relation to the luminous area of the organic light emitting element, the detection area of the organic light detecting element, for example, in relation to an adaptation to the organic light emitting element in terms of geometry, stack and/or circuitry, the distance between the organic light detecting element and the organic light emitting element, the arrangement and number of one or more coupling-out layers and/or the waveguide properties in the substrate or the rest of the layer structure and thus the signal transmission between the organic light emitting element and the organic light detecting element.

FIG. 3 shows an organic optoelectronic component having, in comparison with the exemplary embodiment in FIGS. 2A and 2B, between the organic light emitting element 100 and the organic light detecting element 200 an interspace 113 instead of an electrical insulator layer 112. In those exemplary embodiments, the common encapsulation extends between the elements 100, 200 as far as the common substrate. As a result, by way of example, it is possible to influence the light guiding of internally guided light between the organic light emitting element 100 and the organic light detecting element 200.

FIG. 4A shows one exemplary embodiment of an organic optoelectronic component which, merely by way of example, in comparison with the exemplary embodiment in accordance with FIGS. 2A and 2B, does not have a common encapsulation with a common cover. In particular, the organic light emitting element 100 has a first encapsulation 107, while the organic light detecting element 200 has a second encapsulation 208, which is applied separately from the first encapsulation 107, such that the organic light emitting element 100 and the organic light detecting element 200 are encapsulated independently of one another. As shown in FIG. 3A, an electrical insulator layer 112 not covered by any of the encapsulations 107, 208 can be provided between the organic light emitting element 100 and the organic light detecting element 200.

The encapsulations 107, 208 can be embodied identically or differently and can be adapted to the respective requirements of the organic light emitting element 100 and of the organic light detecting element 200 in particular in terms of the choice of materials, the optical properties and the encapsulation properties. In each case a cover 109, 210 is applied on the encapsulations 107, 208 by means of a respective adhesive layer 108, 209 which cover can be embodied, for example, like the common cover 109 in accordance with the previous exemplary embodiments.

FIG. 4B shows a further exemplary embodiment of an organic optoelectronic component which, in comparison with the previous exemplary embodiment, does not have an electrical insulator layer 112 between the organic light emitting element 100 and the organic light detecting element 200 but rather an interspace 113.

By means of a separate encapsulation 107, 208 for the organic light emitting element 100 and the organic light detecting element 200, it is possible, for example, to influence the light which is directly radiated from the organic light emitting element boo onto the organic light detecting element 200 by scattering and/or waveguiding. Furthermore, the elements 100, 200 can be electrically contacted in the interspace between the encapsulations 107, 208, as shown further below in association with FIGS. 5 and 7.

The organic optoelectronic component in the exemplary embodiments described can comprise, instead of an organic light detecting element 200 embodied as organic photodiode, for example, an organic light detecting element 200 which is embodied as organic photoconductor comprising an organic photoconductive material 207 and generates electrical charges on irradiation by light.

Photoconductive organic materials can be embodied, for example, in one layer on an electrically conductive layer, for example, on an electrode or on the electrode connection pieces without an additional electrode. By way of example, the organic photoconductive material can be based on a PVK-TNF charge transfer complex (PVK: polyvinylcarbazole, TNF: 2,4,7-trinitro-9-fluorenone). Furthermore, the organic photoconductive material can, for example, also be embodied in two layers in the form of an organic charge generation layer and an organic layer that transports charge carriers. Examples of organic materials that generate charge carriers include (di)azo dyes, squaraine derivatives and phthalocyanines, and examples of organic materials that conduct charge carriers include arylamines, oxadiazoles, TPD (N,N'-bis(3-methylphenyl)-N,N'-bis(phenyl)benzidine) and NPB (N,N'-bis(naphthalen-1-yl)-N,N'-bis(phenyl)benzidine). Furthermore, an organic light detecting element 200 embodied as organic photoconductor can have the same construction as the organic light emitting element 100, wherein here it is possible to utilize the depletion layer properties of the at least one pn junction of the organic active layer in the functional layer stacks.

An organic light detecting element 200 embodied as organic photoconductor can be irradiated with ambient light from both sides, that is to say through the substrate and through the encapsulation. In order to prevent ambient light, for example, from one side or internally guided light from being radiated onto the organic photoconductive material, additionally non-transparent insulator layers, electrically insulated metal layers, non-transparent materials for the encapsulation and/or a non-transparent cover, for example, a non-transparent glass cover, can be provided.

Depending on materials and construction of the organic light detecting element 200 the latter can be constructed simultaneously as photoconductor and photodiode. Such an organic light detecting element 200 can be usable as a photodiode with an electrical bias voltage and as a photoconductor without an electrical bias voltage.

Furthermore, depending on materials and construction, the electrical resistance of the organic light detecting element 200 can be measured, such that the organic light detecting element 200 can be embodied and usable as organic photoresistor. By way of example, the organic light detecting element 200 for this purpose can comprise an organic functional layer based on pentacene.

Although the organic light emitting element 100 in the exemplary embodiment shown is embodied as a bottom emitter and emits light through the common substrate, the organic light emitting element 100 can be embodied as a top emitter, wherein here the side with the cover, that is to say the opposite side of the organic optoelectronic component relative to the substrate, forms the emission side. Furthermore, the organic light emitting element 100 can be embodied as a transparent OLED that emits light on both sides.

Furthermore, it is possible to vary the coupling-out layer in comparison with the exemplary embodiments shown previously. By way of example, the coupling-out layer can additionally extend over the organic light detecting element 200, as a result of which, for example, the portion of the light guided internally from the organic light emitting element 100 to the organic light detecting element 200 and/or the portion of the ambient light coupled in can be varied. Furthermore, the coupling-out layer can be arranged on that side of the common substrate which faces the organic functional layer stacks, which can likewise result in influencing of the internally guided light and also of the ambient light coupled into the organic light detecting element 200. As an alternative thereto, a coupling-out layer can be situated only above the organic light detecting element 200 or it is possible for no coupling-out layer to be present. If the organic optoelectronic component, and in particular the organic light emitting element 100, is embodied as a top emitter or as a transparent OLED instead of a bottom emitter, one or a plurality of coupling-out layers in the variants described can be arranged on the side facing away from the substrate, that is to say, for example, on the encapsulation. In particular, one or a plurality of coupling-out layers can be arranged externally, that is to say on an outer side, or internally, that is to say between other layers of the organic optoelectronic component.

Figure 5:
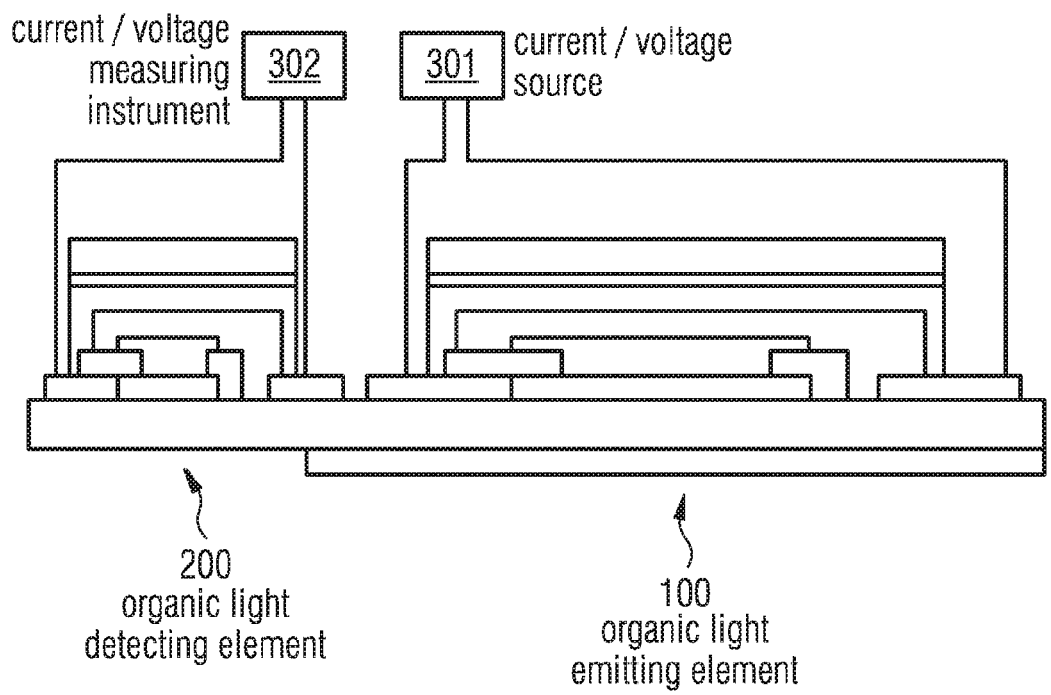

FIG. 5 shows an organic optoelectronic component in accordance with a further exemplary embodiment, which comprises electronic components 301, 302 for electrical interconnection of the at least one organic light emitting element 100 and the at least one organic light detecting element 200. The electronic component 301 is embodied as a current and/or voltage source for the at least one organic light emitting element 100, while the electronic component 302 is a current and/or voltage measuring instrument for measuring the signals of the at least one organic light detecting element 200. For better illustration of the contacting possibility, the variant of the organic optoelectronic component with separate encapsulations is shown, wherein the following description holds true in association with all exemplary embodiments described here for the organic optoelectronic component.

Figure 6A:
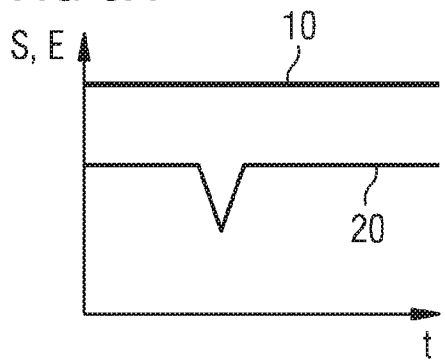
Figure 6B:
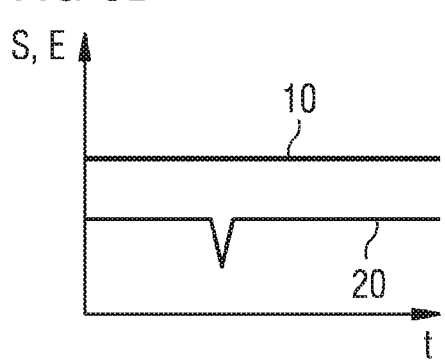
Figure 6C:
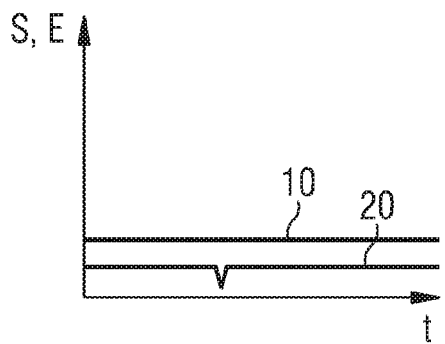

FIGS. 6A to 6C show merely by way of example schematic temporal profiles of the emission intensity E in the form of the intensity 10 of the light emitted by the organic light emitting element 100, and of the signal strength S in the form of the signal 20 detected by the organic light detecting element 200, wherein no feedback of the sensor signal 20 to the light emission takes place as a result of the use of the separate electronic component 301, 302. The different signal strengths S can be caused by ambient light of different brightnesses, for example, ambient light incident through the substrate. In this case, a certain or predominant part of the ambient light can be formed by the light that is emitted by the organic light emitting element 100 and that is reflected back from the surroundings onto the organic light detecting element 200. Furthermore, it may be possible for light emitted by the organic light emitting element 100 internally in the organic optoelectronic component to be guided to the organic light detecting element. Therefore, different signal strengths S can be caused by different emission intensities E, as is evident from the comparison of FIGS. 6A to 6C.

As a result of an external object being briefly swept past the organic light detecting element 200, for example, as a result of a hand, one or more fingers or a stylus, a signal dip in the signal 20 can be attained, as can be discerned in FIGS. 6A to 6C. The dip in the signal strength S can be formed by a voltage dip in the photovoltage, for example, in the case of an organic light detecting element 200 embodied as a photodiode. As a result, the signal 20 has a negative peak, which can form a characteristic signal waveform for regulating the intensity 10, as explained in greater detail in association with the following exemplary embodiments.

Instead of a swiping movement, the dip in the signal strength S of the sensor signal 20 can be generated by the organic light detecting element 200 being momentarily covered.

In FIGS. 6A to 6C and also in the subsequent figures, the characteristic signal waveform is only indicated schematically and may be dependent on the design of the organic light detecting element, that is to say the latter's size, layer construction, contacting and orientation with respect to the detector area, the brightness of the organic light emitting element and the ambient brightness and also a swiping speed and a covering area brought about by the external object.

In the exemplary embodiment in FIG. 7, in comparison with the exemplary embodiment in FIG. 5, a regulatable current and/or voltage source 300 is provided as an electronic component and measures the electrically measurable signal provided by the at least one organic light detecting element 200 and regulates the at least one organic light emitting element 100 depending on the measurement. This enables a method for operating the organic optoelectronic component wherein the intensity of the light emitted by the at least one organic light emitting element 100 is regulated depending on a signal of the at least one organic light detecting element 200, wherein the signal has a characteristic signal waveform that initiates a regulating event, that is to say, for example, switching and/or dimming of the intensity.

The regulatable current and/or voltage source 300 can operate, for example, with regulatable current and/or voltage amplitudes, a pulse width modulation method and/or a pulse frequency modulation method.

As is shown in FIG. 7, the regulatable current and/or voltage source 300 can be an external electronic component which is interconnected with the elements 100, 200 via suitable wire connections or conduction tracks. As an alternative thereto, it may be possible to integrate a regulatable current and/or voltage source at least partly into the organic optoelectronic component, for example, by integration into the common substrate or by arrangement on the common substrate. In other words, the regulatable current and/or voltage source 300 can be provided as a monolithic electronic circuit, for example, in the substrate or in additional functional layers on the substrate. The regulatable current and/or voltage source 300 can have presetting possibilities which enable, for example, a desired brightness to be set depending on the signal of the optoelectronic component.

In the subsequent figures, exemplary embodiments of methods for operating the organic optoelectronic component having a design in accordance with one of the previous exemplary embodiments are described on the basis of temporal profiles of the intensity 10 of the light emitted by the organic light emitting element 100 and of the signal 20 of the organic light detecting element 200. In the case of the methods described below, the at least one organic light detecting element 200 detects ambient light which is radiated onto the organic optoelectronic component. As a result, the intensity 10 of the light emitted by the at least one organic light emitting element 100 is regulated depending on a signal 20 of the at least one organic light detecting element 200 with a characteristic signal waveform.

FIG. 8 shows, for example, a method comprising a switching process wherein the organic light emitting element 100 is switched on by a signal 20—measured by the organic light detecting element 200—with a characteristic signal waveform in the form of a negative peak for the emission of light having an intensity 10.

The characteristic signal waveform can be generated as described above, for example, by an external object being swiped past the organic light detecting element 200. As a result of the organic light detecting element 200 being at least partly covered by the external object at times, this brings about first a falling edge and then a subsequent rising edge in the signal 20 of the organic light detecting element 200 since at times less ambient light can be detected by the organic light detecting element 200.

This characteristic signal waveform is detected and evaluated by the electronic component 300, wherein a reaction to edges and/or absolute values and also a reaction to relative and/or absolute signal changes, for example, with reference to a zero line, are possible. The electronic component 300 can be designed to switch on the organic light emitting element 100 by means of an automated feedback to the latter, for example, in accordance with a chosen presetting, such that the organic light emitting element emits light having an intensity 10 in accordance with a desired emission intensity E.

Light which is emitted by the organic optoelectronic component and which is reflected back to the organic light detecting element 200 by the surroundings and also, depending on the embodiment of the organic optoelectronic component, light which is guided internally in the organic optoelectronic component from the organic light emitting element 100 to the organic light detecting element 200 furthermore result in a passive feedback to the signal 20, which is manifested by the fact that the signal strength S of the signal 20 after the occurrence of the characteristic signal waveform and the regulating event triggered thereby is greater than beforehand.

FIG. 9 shows a further exemplary embodiment, wherein, as regulating event, a switching process that switches on the organic light emitting element 100 by application of a preset voltage and/or a preset current for the emission of a desired light intensity 10 is initiated by virtue of the fact that the signal strength S of the signal 20 with the characteristic signal waveform falls below a preselected limit value 30, indicated by the dashed line. This can make it possible that the detection and the initiation of the regulating event take place with a time delay in comparison with the previous exemplary embodiment and in particular only if a desired reduction of the sensor signal 20 to the limit value 30 is actually measured by the characteristic signal waveform.

Figure 10:
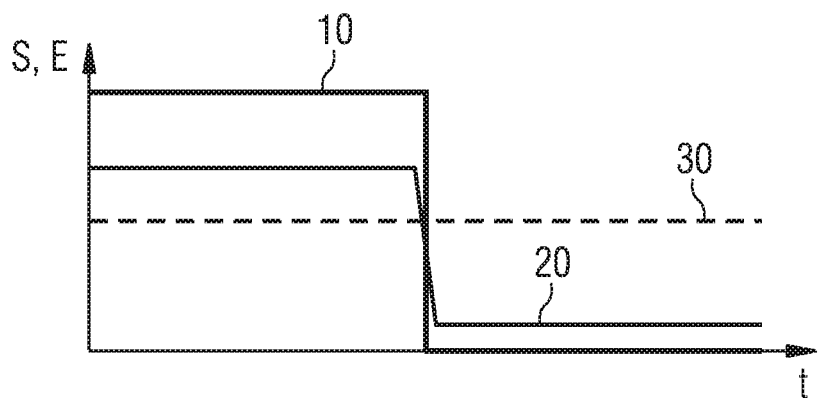

FIG. 10 shows a further exemplary embodiment, wherein the intensity 10 of the organic light emitting element 100 in the event of the signal strength S of the signal 20 falling below a specific preselected limit value 30 likewise leads to a switching process. In comparison with the previous exemplary embodiment, in the exemplary embodiment in FIG. 10, the emission of the organic light emitting element 100 is switched off, however, such that after the switching process the organic light detecting element 200 detects only residual signals in the form of ambient light brought about by stray illumination as a result of other light sources.

Figure 11:
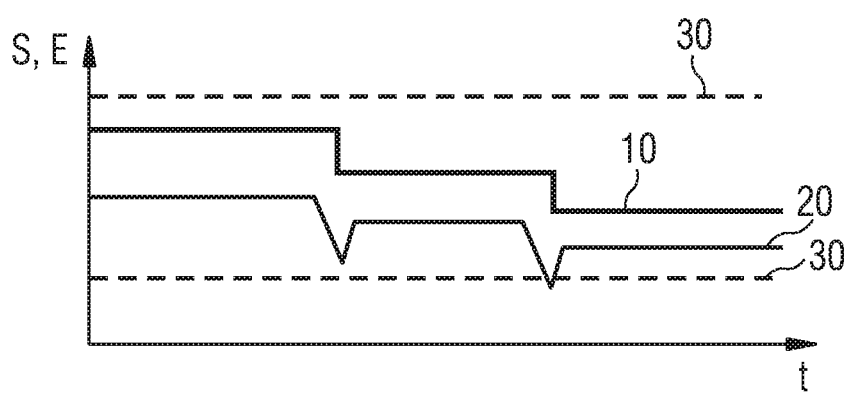

FIG. 11 shows a further exemplary embodiment, wherein a reduction of the intensity 10 is brought about in each case as a result of two temporarily successive characteristic signal waveforms of the signal 20, for example, as a result of successive swiping movements. As a result thereof and as a result of further such swiping movements, the organic light emitting element 100 can be dimmed darker step by step. As an alternative thereto, it is possible for the intensity 10 to be increased step by step. As a result of the above-described feedback of the light emitted by the organic light emitting element 100 to the sensor signal, in the exemplary embodiment shown, the signal strength S of the signal 20 decreases after each switching process. In particular, an electronic regulation with a lowermost and uppermost threshold in the form of the limit values 30 indicated is possible. Furthermore, continuous dimming may be possible instead of the step by step dimming shown.

Figure 12:
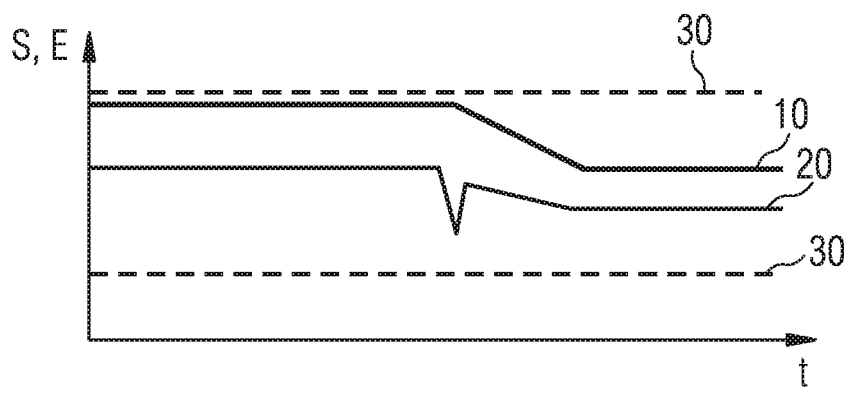

FIG. 12 shows a further exemplary embodiment of dimming with time delay, wherein the intensity 10 of the light emitted by the organic light emitting element 100 is not reduced in one step but rather continuously and with a time delay. The continuous reduction of the intensity 10 is manifested in the case of a passive feedback in the signal 20 of the organic light detecting element 200.

As an alternative to the exemplary embodiments described above and below wherein the characteristic signal waveform of the signal 20 is embodied as a negative peak for the purpose of initiating a regulating event as a result of an external object being swiped past, the characteristic signal waveform provided for regulating purposes can be attained by the organic light detecting element 100 being covered by means of an external object at times. By way of example, a regulating event can be brought about by a characteristic signal waveform during a specific time duration during which the organic light detecting element 200 is covered.

Figure 13A:
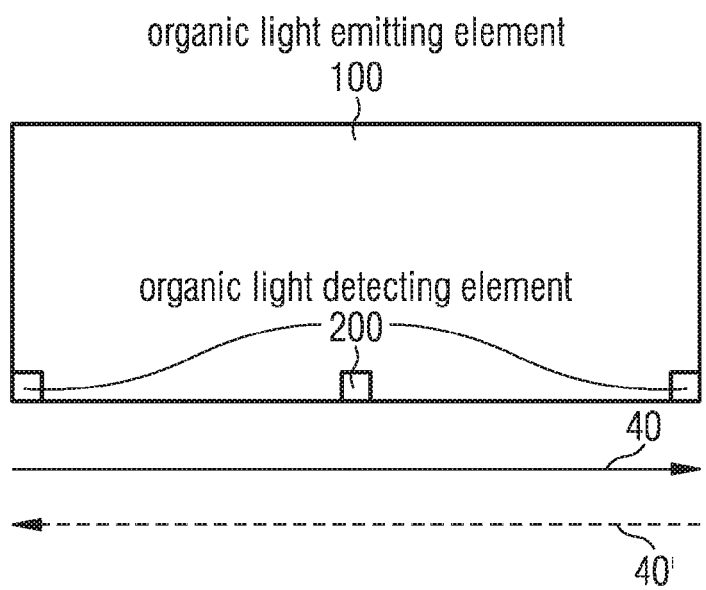

FIG. 13A shows one exemplary embodiment of an organic optoelectronic component comprising a plurality of organic light detecting elements 200 in a plan view of the emission side, wherein, for the sake of clarity, only the positions of the organic light emitting elements 200 and of the organic light detecting element 100 are indicated, without precise illustration of the luminous area and the contact feeds. As a mere example, the organic optoelectronic component comprises three organic light detecting elements 200. As an alternative thereto, only two or more than three organic light detecting elements 200 can be present.

Methods for operating the organic optoelectronic component are thereby possible in which the intensity 10 of the light emitted by the at least one organic light emitting element 100 is regulated depending on a temporal succession of at least two signals 20, 20' from at least two of the organic light detecting elements 200, wherein the signals 20, 20' in each case have a characteristic signal waveform.

Figure 13B:
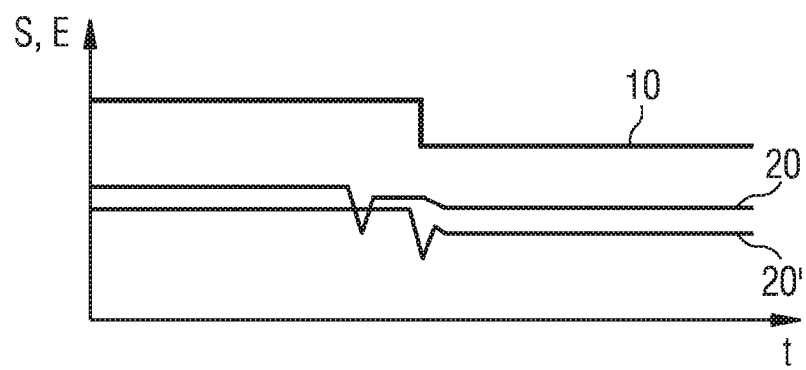

FIG. 13B shows one exemplary embodiment of such a method, wherein the regulating is carried out depending on the characteristic signal waveforms in the form of negative peaks which take place temporarily successively. The signal 20 can be, for example, that of the left organic light detecting element 200 shown in FIG. 13A, while the signal 20' is that of the central light detecting element 200. Furthermore, the signals of the central and right organic light detecting elements 200 or from all three organic light detecting elements can be used for regulation. In particular, organic light detecting elements 200 adjacent to one another can be provided for this purpose.

The detection by means of a plurality of organic light detecting elements 200 permits in particular the detection of a movement direction of a swiping movement 40 from left to right or a swiping movement 40' from right to left of an external object over the organic light detecting elements 200, such that dimming to higher or lower intensities 10 is possible, for example, depending on the swiping direction. The reaction can take place, for example, to a temporal succession of the rising and/or falling edges of the characteristic signal waveforms. Multi-stage dimming may be possible as a result of repeated successive swiping, which may be advantageous, for example, for applications such as desk lamps or lighting systems for living areas in which brightness regulation without mere switching may be desirable.

As described in association with Figure ii, for example, this regulation can be combined with limit values for an upper and/or lower limit, wherein, upon the latter being reached, a reaction to the swiping movements no longer occurs.

Figure 13C:
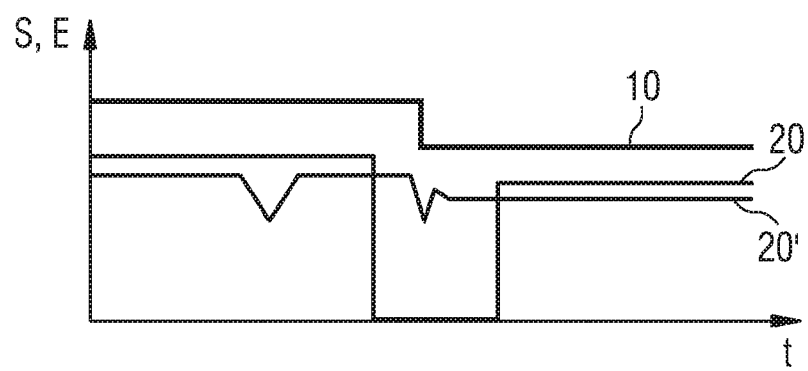

FIG. 13C shows a further exemplary embodiment, wherein a first signal 20 is generated by one of the plurality of organic light detecting elements 200 being at least partly covered with an external object, and a second signal 20' is generated by an external object being swiped past another of the plurality of the organic light detecting elements 200 of the organic optoelectronic component in FIG. 13A. As an alternative thereto, the second signal 20' can be generated, for example, by another of the plurality of the organic light detecting elements 200 being covered with an external object.

By way of example, the first signal can be that of the left organic light detecting element 200 in FIG. 13A, which serves as a trigger for the further detection of characteristic signal waveforms in the signals of the other organic light detecting elements 200. As is shown in FIG. 13C, a characteristic signal waveform of the signal 20' in the form of a negative peak leads to a regulation of the intensity 10 only if the first signal 20 exhibits the desired characteristic signal waveform beforehand and/or at the same time, since the first negative peak in the signal 20' does not yet initiate a regulating event.

By way of example, the regulation can be carried out in such a way that the intensity 10 as shown in FIG. 13C is dimmed darker upon the actuation of the left organic light detecting element 200 and of the central organic light detecting element 200, while the intensity 10 is dimmed to a brighter level upon actuation of the left organic light detecting element 200 and the right organic light detecting element 200. By contrast, no regulation is carried out upon actuation of the central and right organic light detecting elements 200.

By way of example, the described control can be carried out by the use of a plurality of fingers, for example, the thumb and index finger, as cover or swiper on or over two organic light detecting elements 200.

In association with the subsequent figures, a description is given of exemplary embodiments of methods for operating an organic optoelectronic component in which the intensity of the light emitted by a plurality of organic light emitting elements 100 is regulated depending on the signal of one or a plurality of organic light detecting elements 200. The exemplary embodiments shown in the subsequent figures can be combined in any desired manner in particular with the previous exemplary embodiments of the method for operating an organic optoelectronic component.

Figure 14A:
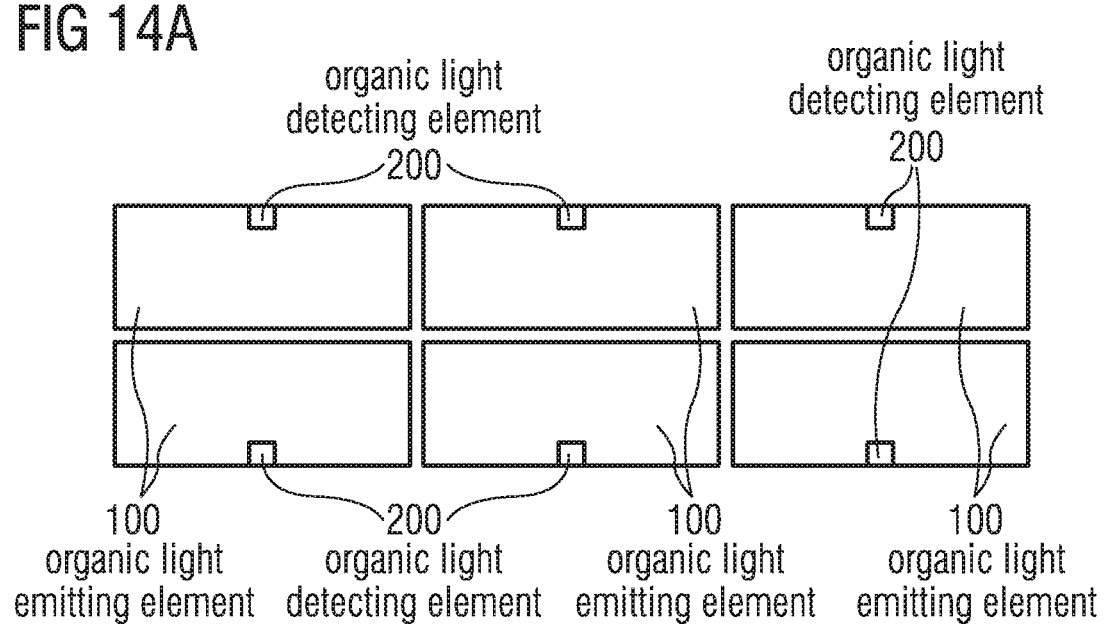

FIG. 14A shows an organic optoelectronic component in plan view, which comprises a plurality of organic light emitting elements 100 on the common substrate. Each of the organic light emitting elements 100 is assigned an organic light detecting element 200 arranged in the region of the emission area of the respective organic light emitting element 100.

Figure 14B:
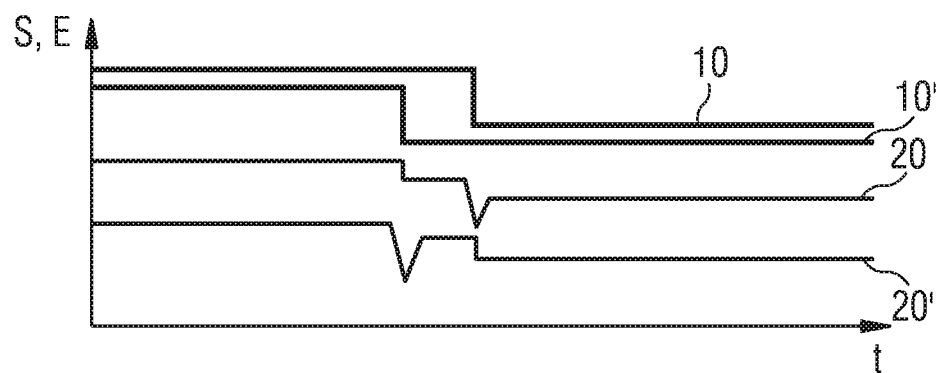

FIG. 14B shows the intensities 10, 10' and the sensor signals 20, 20' by way of example from two pairs of mutually assigned elements 100 and 200. The intensity 10 is reduced merely by way of example by a characteristic signal waveform in the sensor signal 20, while the intensity 10' is reduced by a characteristic signal waveform in the sensor signal 20'. As can be determined in FIG. 14B, it may be possible for the signals of the respectively non-assigned organic light detecting elements 200 to be influenced by the regulating events and the associated intensity changes on account of a passive feedback described above. On account of the initiation of regulating events only by the characteristic signal waveforms, these signal changes brought about by passive feedbacks do not initiate further regulating events, however, and so the organic light emitting elements 100 can be regulated independently of one another and without mutual influencing.

In particular, it is thereby possible for a plurality of organic light emitting elements 100 to be regulatable separately from one another since each of the organic light emitting elements 100 is assigned an organic light detecting element 200 and the regulation is brought about only by the characteristic signal waveforms in the signals of the assigned organic light detecting elements 200. Individual switching and/or dimming of different surface light elements are/is thus possible.

The organic optoelectronic component shown in FIG. 14A can be used, for example, particularly preferably in ceiling lighting systems or floor lighting systems, wherein in the latter an actuation can be carried out, for example, by shoes or heels as external objects.

Figure 15A:
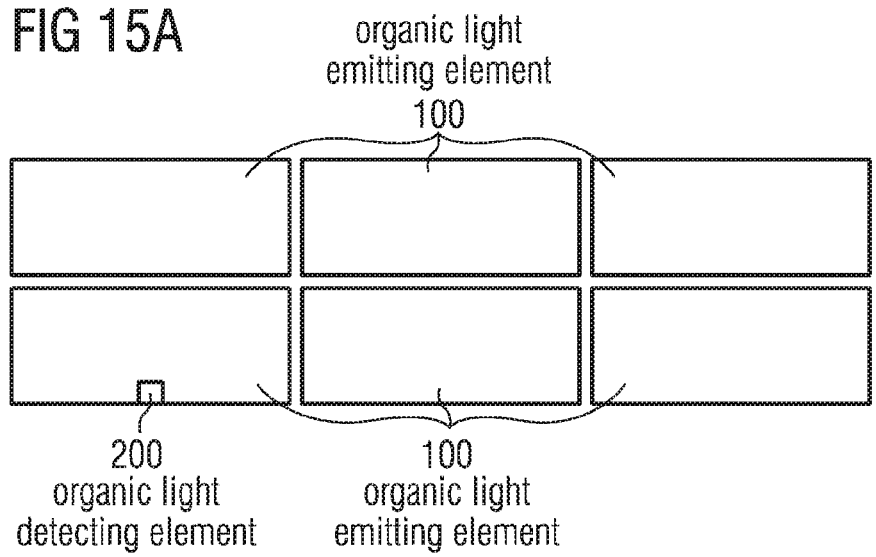

FIG. 15A shows an organic optoelectronic component comprising a plurality of organic light emitting elements 100, to all of which an organic light detecting element 200 is assigned. As is shown in FIG. 15B, a regulation of the respective light intensities 10, 10', 10'', 10''', 10'''', 10''''' can be effected by the one organic light detecting element 200.

Figure 16:
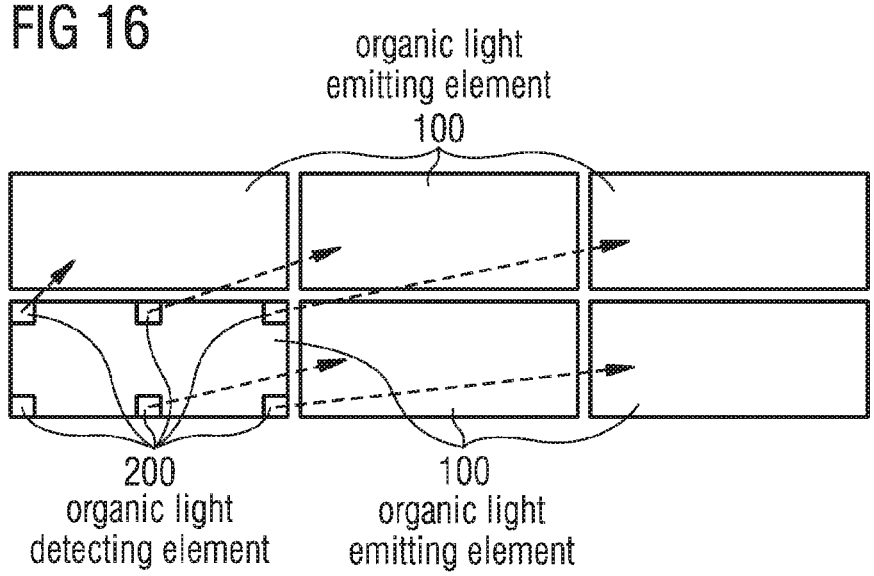

FIG. 16 shows an organic optoelectronic component in which, as in the exemplary embodiment in FIGS. 14A and 14B, each of the plurality of organic light emitting elements 100 is assigned an organic light detecting element 200, as indicated by the dashed arrows, wherein all the organic light detecting elements 200 are situated in the region of the luminous area of one of the organic light emitting elements 100. The latter forms a master element, which can be arranged with the other organic light emitting elements 100 on a common substrate or separately from the other organic light emitting elements 100 and can have a different design, for example. By way of example, the master element can be arranged on the floor of a room, while the other organic light emitting elements 100 form a ceiling lighting system.

FIGS. 17A to 17C show further exemplary embodiments of organic optoelectronic components which in each case comprise a plurality of organic light emitting elements 100 and a plurality of organic light detecting elements 200. A respective one of the organic light detecting elements 200 regulates a specific number of organic light emitting elements 100, wherein the assignment can be variably programmable. In particular, respectively different numbers of organic light emitting elements 100 can be regulatable by the organic light detecting elements 200.

Figure 15B:
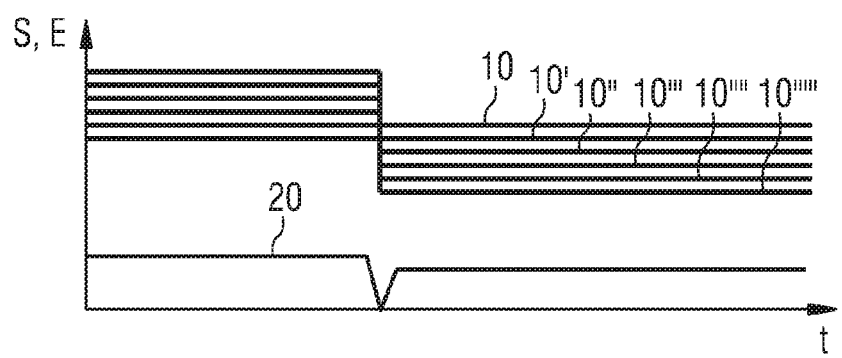

As an alternative to the exemplary embodiments shown, an organic light detecting element can be arranged in the region of the luminous area of each of the organic light emitting elements 100, wherein the organic light detecting element can be activated as required, such that regulations in accordance with the exemplary embodiment in FIGS. 14A, 14B and in accordance with the exemplary embodiment in FIGS. 15A, 15B are possible in an arbitrarily selectable manner.

The number of respectively regulated organic light emitting elements 100 and the designs thereof can be adapted to the lighting conditions striven for and, for example, to the spatial shape of the space to be illuminated. In particular, the organic light emitting elements 100 described here and in the previous exemplary embodiments can have a shape which deviates from a rectangular shape and is formed, for example, by some other polygonal shape, a round shape or a freeform shape.

During the operation of the organic optoelectronic components shown here by means of the method described here, it may be possible that, for example, covered surfaces capable of luminosity, for example, in the case of disguised room ceilings, are switched off automatically. Furthermore, for example, individually positionable lighting units are possible, which can be fitted to walls or ceilings, for example, in a targeted manner by a user and which can be operated without mechanical switches by means of the method described here.

The features and exemplary embodiments described in association with the figures can be combined with one another in accordance with further exemplary embodiments if such combinations are not explicitly described with the individual figures. Furthermore, the exemplary embodiments shown in the figures can have further or alternative features in accordance with the general description.

The invention is not restricted to the exemplary embodiments by the description on the basis of the exemplary embodiments. Rather, the invention encompasses any novel feature and also any combination of features, which in particular includes any combination of features in the patent claims, if this feature or this combination itself is not explicitly specified in the patent claims or exemplary embodiments.

What is claimed is:

1. A method for operating an organic optoelectronic component that comprises an organic light emitting element having an organic functional layer stack having an organic light emitting layer between two electrodes and an organic light detecting element having an organic light detecting layer, the organic light emitting element and the organic light detecting element being arranged on a common substrate in laterally adjacent area regions, the method comprising:
    detecting, by the organic light detecting element, ambient light incident on the organic optoelectronic component; and
    regulating an intensity of light emitted by the organic light emitting element based on a signal of the organic light detecting element with a characteristic signal waveform,
    wherein the organic light detecting element and the organic light emitting element have a substantially identical construction,
    wherein the organic light detecting element and the organic light emitting element are located in a common plane which is oriented perpendicularly to a stacking direction of the electrodes and of the organic functional layer stack of the organic light emitting element, and
    wherein the signal with the characteristic signal waveform is generated by the organic light detecting element being at least partly covered with an external object.

2. The method according to claim 1, wherein an area covered on the common substrate by organic light detecting elements is at most ten percent of an area covered on the common substrate by organic light emitting elements, and wherein the organic light emitting element has an area of greater than or equal to one square centimeter.

3. A method for operating an organic optoelectronic component that comprises an organic light emitting element having an organic functional layer stack having an organic light emitting layer between two electrodes and an organic light detecting element having an organic light detecting layer, the organic light emitting element and the organic light detecting element being arranged on a common substrate in laterally adjacent area regions, the method comprising:
    detecting, by the organic light detecting element, ambient light incident on the organic optoelectronic component; and
    regulating an intensity of light emitted by the organic light emitting element based on a signal of the organic light detecting element with a characteristic signal waveform,
    wherein the organic light detecting element and the organic light emitting element have a substantially identical construction,
    wherein the organic light detecting element and the organic light emitting element are located in a common plane which is oriented perpendicularly to a stacking direction of the electrodes and of the organic functional layer stack of the organic light emitting element, and
    wherein the signal with the characteristic signal waveform is generated by an external object swiping past the organic light detecting element.

4. The method according to claim 1, wherein the characteristic signal waveform is a negative peak.

5. The method according to claim 1, wherein the intensity of the light emitted by the organic light emitting element is regulated when the signal falls below a chosen limit value.

6. The method according to claim 1, wherein a plurality of organic light detecting elements is arranged on the common substrate.

7. The method according to claim 6, wherein the intensity of the light emitted by the organic light emitting element is regulated depending on a temporal succession of at least two signals from at least two organic light detecting elements with a respective characteristic signal waveform.

8. The method according to claim 7, wherein the characteristic signal waveform of each of the at least two signals is a negative peak, and the negative peaks take place temporally successively.

9. The method according to claim 8, wherein the negative peaks are generated by an external object swiping past the at least two organic light detecting elements.

10. The method according to claim 7, wherein the at least two organic light detecting elements are organic light detecting elements adjacent to one another.

11. The method according to claim 7, wherein a first signal is generated by one of the plurality of organic light detecting elements being at least partly covered with an external object, and a second signal is generated by another of the plurality of organic light detecting elements being covered with an external object.

12. The method according to claim 7, wherein a first signal is generated by one of the plurality of organic light detecting elements being covered with an external object, and a second signal is generated by an external object swiping past another of the plurality of organic light detecting elements.

13. The method according to claim 1, wherein the organic light detecting element also detects light that is emitted by the organic light emitting element and that is guided internally in the organic optoelectronic component to the organic light detecting element.

14. The method according to claim 1, wherein the organic light detecting element is embodied as an organic photodiode or as an organic photoconductor, and the signal is a photovoltage or a photocurrent.

15. The method according to claim 3, wherein the external object does not touch the organic light detecting element and has a distance of at least 1 cm and at most 1 m to the organic light detecting element.

16. A method for operating an organic optoelectronic component that comprises a plurality of organic light emitting elements each having an organic functional layer stack having an organic light emitting layer between two electrodes and a plurality of organic light detecting elements each having an organic light detecting layer, the organic light emitting elements and the organic light detecting elements being arranged on a common substrate in laterally adjacent area regions, the method comprising:

detecting, by the organic light detecting elements, ambient light incident on the organic optoelectronic component; and regulating an intensity of light emitted by the organic light emitting elements based on signals of the organic light detecting elements with characteristic signal waveforms, wherein the organic light detecting elements and the organic light emitting elements have a substantially identical construction, wherein the organic light detecting elements and the organic light emitting elements are located in a common plane which is oriented perpendicularly to a stacking direction of the electrodes and of the organic functional layer stack of the organic light emitting elements, wherein the intensity of the light emitted by the plurality of organic light emitting elements is regulated depending on a signal from at least one organic light detecting elements with the characteristic signal waveforms, and wherein one organic light detecting element is assigned to each organic light emitting element.

* * * * *

UNITED STATES PATENT AND TRADEMARK OFFICE
CERTIFICATE OF CORRECTION

PATENT NO. : 9,721,993 B2
APPLICATION NO. : 15/184633
DATED : August 1, 2017
INVENTOR(S) : Michael Popp Page 1 of 1

It is certified that error appears in the above-identified patent and that said Letters Patent is hereby corrected as shown below:

In the Claims

In Column 28, Line 15, Claim 16, delete "at least one organic" and insert --at least one of the organic--.

Signed and Sealed this
Fifth Day of December, 2017

Joseph Matal
*Performing the Functions and Duties of the*
*Under Secretary of Commerce for Intellectual Property and*
*Director of the United States Patent and Trademark Office*